(12) United States Patent
Choi et al.

(10) Patent No.: US 12,035,491 B2
(45) Date of Patent: Jul. 9, 2024

(54) ELECTRONIC DEVICE INCLUDING FLEXIBLE DISPLAY

(71) Applicant: Samsung Electronics Co., Ltd., Suwon-si (KR)

(72) Inventors: Junyoung Choi, Suwon-si (KR); Youngmin Kang, Suwon-si (KR); Moonchul Shin, Suwon-si (KR); Yeonggyu Yoon, Suwon-si (KR); Seungjoon Lee, Suwon-si (KR); Joongyeon Cho, Suwon-si (KR); Yangwook Kim, Suwon-si (KR); Byounguk Yoon, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 271 days.

(21) Appl. No.: 17/525,337

(22) Filed: Nov. 12, 2021

(65) Prior Publication Data
US 2022/0174829 A1     Jun. 2, 2022

Related U.S. Application Data

(63) Continuation of application No. PCT/KR2021/016434, filed on Nov. 11, 2021.

(30) Foreign Application Priority Data

Dec. 2, 2020 (KR) .................. 10-2020-0166601
May 26, 2021 (KR) .................. 10-2021-0067484

(51) Int. Cl.
*H05K 5/02* (2006.01)
*H05K 5/00* (2006.01)

(52) U.S. Cl.
CPC ......... *H05K 5/0217* (2013.01); *H05K 5/0017* (2013.01)

(58) Field of Classification Search
CPC ...... H05K 5/0217; H05K 5/0017; G06F 1/16; G06F 1/1624; G06F 1/1637; G06F 1/1652
See application file for complete search history.

(56) References Cited

U.S. PATENT DOCUMENTS 10,742,784 B1    8/2020  Jo et al.
10,747,269 B1 *  8/2020  Choi .................. H04M 1/0237
(Continued)

FOREIGN PATENT DOCUMENTS

CN    206364856 U    7/2017
CN    209731322 U   12/2019
(Continued)

OTHER PUBLICATIONS

International Search Report and Written Opinion dated Feb. 11, 2022, issued in International Patent Application No. PCT/KR2021/016434.

(Continued)

*Primary Examiner* — Abhishek M Rathod
(74) *Attorney, Agent, or Firm* — Jefferson IP Law, LLP

(57) ABSTRACT

An electronic device is provided. The electronic device includes a flexible display including a first area disposed to be visible to the outside and a second area extending from the first area and disposed to be accommodated inside the electronic device in a first state and to be at least partially visible to the outside in a second state, a bendable member disposed on the rear surface of the flexible display and configured to support the flexible display in the first state and the second state, a case configured to support at least a portion of the flexible display, a sliding frame slidably coupled to the case and including a slide plate having a plurality of first guide slits formed therein and a sliding bar extending from the slide plate and coming into contact with the bendable member in the second state, and a plurality of driving bodies configured to enable sliding movement of the flexible display while switching from the first state to the second state.

20 Claims, 34 Drawing Sheets

(56) References Cited

U.S. PATENT DOCUMENTS

| | | | |
|---|---|---|---|
| 10,955,876 B1* | 3/2021 | Song | G06F 1/1652 |
| 11,435,782 B2* | 9/2022 | Yoo | G06F 1/1652 |
| 11,775,016 B2* | 10/2023 | Choi | G06F 1/1681 |
| | | | 361/679.01 |
| 2012/0026656 A1 | 2/2012 | Lee et al. | |
| 2019/0268455 A1 | 8/2019 | Baek et al. | |
| 2020/0033913 A1* | 1/2020 | Yang | H04M 1/0268 |
| 2021/0004055 A1 | 1/2021 | Chueh et al. | |
| 2021/0185835 A1* | 6/2021 | Song | G02F 1/13332 |
| 2021/0320992 A1 | 10/2021 | Song et al. | |
| 2022/0253103 A1* | 8/2022 | Choi | G09F 9/301 |
| 2022/0263932 A1 | 8/2022 | Jo et al. | |

FOREIGN PATENT DOCUMENTS

| | | |
|---|---|---|
| EP | 2 413 573 A1 | 2/2012 |
| JP | 2005-215648 A | 8/2005 |
| KR | 10-2011-0082943 A | 7/2011 |
| KR | 10-2017-0116551 A | 10/2017 |
| KR | 10-2019-0101605 A | 9/2019 |
| KR | 10-2020-0124989 A | 11/2020 |
| KR | 10-2022-0150318 A | 11/2022 |
| TW | M592168 U | 3/2020 |
| WO | 2021/025181 A1 | 2/2021 |
| WO | 2021/206191 A1 | 10/2021 |
| WO | 2022/114264 A1 | 6/2022 |

OTHER PUBLICATIONS

European Search Report dated Nov. 16, 2023; European Appln. No. 21900854.7-1224 / 4155864 PCT/KR2021016434.

* cited by examiner

ELECTRONIC DEVICE INCLUDING FLEXIBLE DISPLAY

CROSS-REFERENCE TO RELATED APPLICATION(S)

This application is a continuation application, claiming priority under § 365(c), of an International application No. PCT/PCT/KR2021/016434, filed on Nov. 11, 2021, which is based on and claims the benefit of a Korean patent application number 10-2020-0166601, filed on Dec. 2, 2020, in the Korean Intellectual Property Office, and of a Korean patent application number 10-2021-0067484, filed on May 26, 2021, in the Korean Intellectual Property Office, the disclosure of each of which is incorporated by reference herein in its entirety.

TECHNICAL FIELD

The disclosure relates to an electronic device including a flexible display.

BACKGROUND ART

Electronic devices are gradually becoming slimmer, and are being improved to increase rigidity, strengthen design, and differentiate functional elements thereof. Electronic devices are being transformed from a uniform rectangular shape into a variety of shapes. Electronic devices may have a deformable structure enabling use of a large-screen display while providing convenient portability. For example, as an example of a deformable structure, an electronic device may have a structure in which the display area of a flexible display can be varied by supporting housings that slide with respect to each other (e.g., a rollable structure or a slidable structure). A rollable electronic device (or a slidable electronic device) may be configured such that a flexible display can be rolled up or unfolded, and a slidable electronic device may be configured such that a flexible display moves in a sliding manner, thereby expanding and contracting a screen.

The above information is presented as background information only to assist with an understanding of the disclosure. No determination has been made, and no assertion is made, as to whether any of the above might be applicable as prior art with regard to the disclosure.

DISCLOSURE OF INVENTION

Technical Problem

An electronic device may include a rollable electronic device (e.g., a slidable electronic device) in which the display area of a display can be expanded and/or reduced. The rollable electronic device may include a first housing (e.g., a first housing structure, a base housing, a base bracket, or a base structure) and a second housing (e.g., a second housing, a slide housing, a slide bracket, or a slide structure), which are coupled to each other to move relative to each other so as to be at least partially fitted together with each other. For example, the first housing and the second housing may operate to slide with respect to each other, and support and guide at least a portion of a flexible display (e.g., an expandable display or a stretchable display) such that the flexible display has a first display area in a slide-in state and such that the flexible display has a second display area, which is greater than the first display area, in a slide-out state.

The rollable electronic device may include a bendable member (e.g., a multi-bar assembly) for supporting at least a portion of the flexible display when the second housing moves by a specified distance from the first housing. At least a portion of the flexible display, when the electronic device is in a slide-in state, may slide in the inner space of the first housing or the inner space of the second housing to be bent while being supported by a bendable member. In addition, the electronic device may include at least one pressing member (e.g., a sliding frame) for pressing the rear surface of the bendable member in a slide-out direction while the electronic device is switching from the slide-in state to the slide-out state.

However, since such a pressing member provides a pressing force while being in contact with the bendable member, frictional resistance increases, and thus a relatively large driving force is required, which may reduce usability or cause much power consumption, and may cause a problem such as malfunction of the electronic device or noise.

Aspects of the disclosure are to address at least the above-mentioned problems and/or disadvantages and to provide at least the advantages described below. Accordingly, an aspect of the disclosure is to provide an electronic device including a flexible display capable of reducing frictional force between a bendable member supporting the flexible display and a pressing member pressing the same.

Another aspect of the disclosure is to provide an electronic device including a flexible display capable of providing an efficient driving force according to sliding-in/sliding-out by reducing the frictional force between the bendable member and the pressing member and helping in reducing noise.

However, the problems to be solved in the disclosure are not limited to the above-mentioned problems, and may be variously expanded without departing from the concept and scope of the disclosure.

Additional aspects will be set forth in part in the description which follows and, in part, will be apparent from the description, or may be learned by practice of the presented embodiments.

Solution to Problem

In accordance with an aspect of the disclosure, an electronic device is provided. The electronic device includes a flexible display including a first area disposed to be visible to the outside and a second area extending from the first area and disposed to be accommodated inside the electronic device in a first state and to be at least partially visible to the outside in a second state, a bendable member disposed on the rear surface of the flexible display and configured to support the flexible display in the first state and the second state, a case configured to support at least a portion of the flexible display, a sliding frame slidably coupled to the case and including a slide plate having a plurality of first guide slits formed therein and a sliding bar extending from the slide plate and coming into contact with the bendable member in the second state, and a plurality of driving bodies configured to enable sliding movement of the flexible display while switching from the first state to the second state.

Advantageous Effects of Invention

An electronic device according to various embodiments of the disclosure may reduce friction between components supporting expansion and contraction of a screen when the screen of the display is expanded or contracted, thereby reducing the power required for expansion and contraction of the screen of the display.

In addition, various effects directly or indirectly recognized through this document may be provided.

Other aspects, advantages, and salient features of the disclosure will become apparent to those skilled in the art from the following detailed description, which, taken in conjunction with the annexed drawings, discloses various embodiments of the disclosure.

BRIEF DESCRIPTION OF DRAWINGS

The above and other aspects, features, and advantages of certain embodiments of the disclosure will be more apparent from the following description taken in conjunction with the accompanying drawings, in which.

Throughout the drawings, it should be noted that like reference numbers are used to depict the same or similar elements, features, and structures.

BEST MODE FOR CARRYING OUT THE INVENTION

The following description with reference to the accompanying drawings is provided to assist in a comprehensive understanding of various embodiments of the disclosure as defined by the claims and their equivalents. It includes various specific details to assist in that understanding but these are to be regarded as merely exemplary. Accordingly, those of ordinary skill in the art will recognize that various changes and modifications of the various embodiments described herein can be made without departing from the scope and spirit of the disclosure. In addition, descriptions of well-known functions and constructions may be omitted for clarity and conciseness.

The terms and words used in the following description and claims are not limited to the bibliographical meanings, but, are merely used by the inventor to enable a clear and consistent understanding of the disclosure. Accordingly, it should be apparent to those skilled in the art that the following description of various embodiments of the disclosure is provided for illustration purpose only and not for the purpose of limiting the disclosure as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

Figure 1:
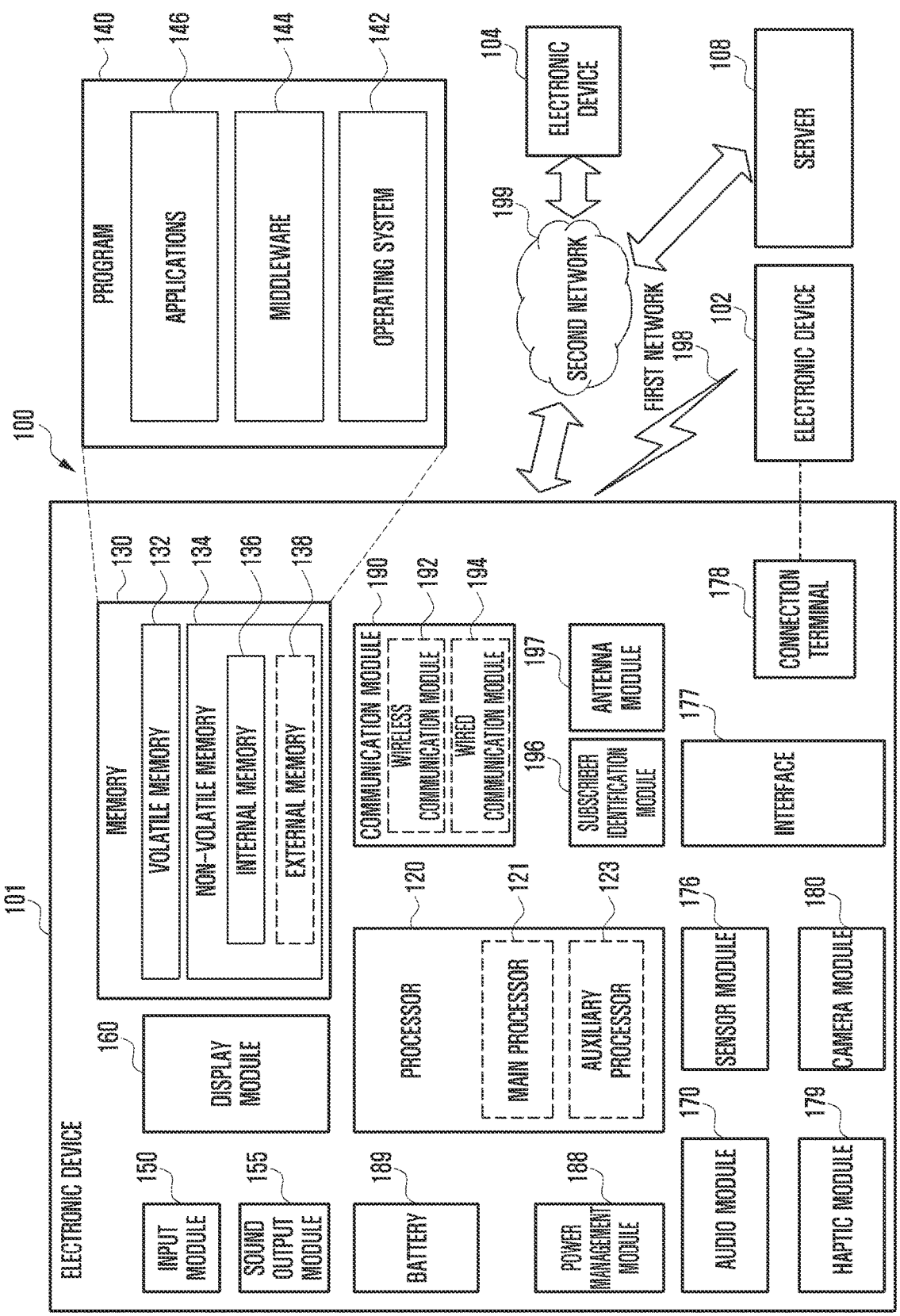
FIG. 1 is a block diagram of an electronic device in a network environment according to an embodiment of the disclosure.

FIG. 1 illustrates an electronic device in a network environment according to an embodiment of the disclosure.

Referring to FIG. 1, an electronic device 101 in a network environment 100 may communicate with an electronic device 102 via a first network 198 (e.g., a short-range wireless communication network), or an electronic device 104 or a server 108 via a second network 199 (e.g., a long-range wireless communication network). The electronic device 101 may communicate with the electronic device 104 via the server 108. The electronic device 101 includes a processor 120, memory 130, an input device 150, an audio output device 155, a display device 160, an audio module 170, a sensor module 176, an interface 177, a haptic module 179, a camera module 180, a power management module 188, a battery 189, a communication module 190, a subscriber identification module (SIM) 196, or an antenna module 197. In some embodiments, at least one (e.g., the display device 160 or the camera module 180) of the components may be omitted from the electronic device 101, or one or more other components may be added in the electronic device 101. In some embodiments, some of the components may be implemented as single integrated circuitry. For example, the sensor module 176 (e.g., a fingerprint sensor, an iris sensor, or an illuminance sensor) may be implemented as embedded in the display device 160 (e.g., a display).

The processor 120 may execute, for example, software (e.g., a program 140) to control at least one other component (e.g., a hardware or software component) of the electronic device 101 coupled with the processor 120, and may perform various data processing or computation. As at least part of the data processing or computation, the processor 120 may load a command or data received from another component (e.g., the sensor module 176 or the communication module 190) in volatile memory 132, process the command or the data stored in the volatile memory 132, and store resulting data in non-volatile memory 134. The processor 120 may include a main processor 121 (e.g., a central processing unit (CPU) or an application processor (AP)), and an auxiliary processor 123 (e.g., a graphics processing unit (GPU), an image signal processor (ISP), a sensor hub processor, or a communication processor (CP)) that is operable independently from, or in conjunction with, the main processor 121. Additionally, or alternatively, the auxiliary processor 123 may be adapted to consume less power than the main processor 121, or to be specific to a specified function. The auxiliary processor 123 may be implemented as separate from, or as part of the main processor 121.

The auxiliary processor 123 may control at least some of functions or states related to at least one component (e.g., the display device 160, the sensor module 176, or the communication module 190) among the components of the electronic device 101, instead of the main processor 121 while the main processor 121 is in an inactive (e.g., sleep) state, or together with the main processor 121 while the main processor 121 is in an active state (e.g., executing an application). The auxiliary processor 123 (e.g., an ISP or a CP) may be implemented as part of another component (e.g., the camera module 180 or the communication module 190) functionally related to the auxiliary processor 123.

The memory 130 may store various data used by at least one component (e.g., the processor 120 or the sensor module 176) of the electronic device 101. The various data may include, for example, software (e.g., the program 140) and input data or output data for a command related thereto. The memory 130 may include the volatile memory 132 or the non-volatile memory 134. The non-volatile memory 134 may include internal memory 136 and external memory 138.

The program 140 may be stored in the memory 130 as software, and may include, for example, an operating system (OS) 142, middleware 144, or an application 146.

The input device 150 may receive a command or data to be used by another component (e.g., the processor 120) of the electronic device 101, from the outside (e.g., a user) of the electronic device 101. The input device 150 may include, for example, a microphone, a mouse, a keyboard, or a digital pen (e.g., a stylus pen).

The audio output device 155 may output sound signals to the outside of the electronic device 101. The audio output device 155 may include, for example, a speaker or a receiver. The speaker may be used for general purposes, such as playing multimedia or playing record, and the receiver may be used for an incoming calls. The receiver may be implemented as separate from, or as part of the speaker.

The display device 160 may visually provide information to the outside (e.g., a user) of the electronic device 101. The display device 160 may include, for example, a display, a hologram device, or a projector and control circuitry to control a corresponding one of the display, hologram device, and projector. The display device 160 may include touch circuitry adapted to detect a touch, or sensor circuitry (e.g., a pressure sensor) adapted to measure the intensity of force incurred by the touch.

The audio module 170 may convert a sound into an electrical signal and vice versa. The audio module 170 may obtain the sound via the input device 150, or output the sound via the audio output device 155 or a headphone of an external electronic device (e.g., an electronic device 102) directly (e.g., wired) or wirelessly coupled with the electronic device 101.

The sensor module 176 may detect an operational state (e.g., power or temperature) of the electronic device 101 or an environmental state (e.g., a state of a user) external to the electronic device 101, and then generate an electrical signal or data value corresponding to the detected state. The sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the electronic device 102) directly (e.g., wired) or wirelessly. The interface 177 may include, for example, a high definition multimedia interface (HDMI), a universal serial bus (USB) interface, a secure digital (SD) card interface, or an audio interface.

A connection terminal 178 may include a connector via which the electronic device 101 may be physically connected with the external electronic device (e.g., the electronic device 102). The connection terminal 178 may include, for example, a HDMI connector, a USB connector, a SD card connector, or an audio connector (e.g., a headphone connector).

The haptic module 179 may convert an electrical signal into a mechanical stimulus (e.g., a vibration or a movement) or electrical stimulus which may be recognized by a user via his tactile sensation or kinesthetic sensation. The haptic module 179 may include, for example, a motor, a piezoelectric element, or an electric stimulator.

The camera module 180 may capture an image or moving images. The camera module 180 may include one or more lenses, image sensors, image signal processors, or flashes.

The power management module 188 may manage power supplied to the electronic device 101. The power management module 188 may be implemented as at least part of, for example, a power management integrated circuit (PMIC).

The battery 189 may supply power to at least one component of the electronic device 101. The battery 189 may include, for example, a primary cell which is not rechargeable, a secondary cell which is rechargeable, or a fuel cell.

The communication module 190 may support establishing a direct (e.g., wired) communication channel or a wireless communication channel between the electronic device 101 and the external electronic device (e.g., the electronic device 102, the electronic device 104, or the server 108) and performing communication via the established communication channel. The communication module 190 may include one or more communication processors that are operable independently from the processor 120 (e.g., the AP) and supports a direct (e.g., wired) communication or a wireless communication. The communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module). A corresponding one of these communication modules may communicate with the external electronic device via the first network 198 (e.g., a short-range communication network, such as Bluetooth™, wireless-fidelity (Wi-Fi) direct, or infrared data association (IrDA)) or the second network 199 (e.g., a long-range communication network, such as a cellular network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 192 may identify and authenticate the electronic device 101 in a communication network, such as the first network 198 or the second network 199, using subscriber information (e.g., international mobile subscriber identity (IMSI)) stored in the SIM 196.

The wireless communication module 192 may support a 5G network, after a 4G network, and next-generation communication technology, e.g., new radio (NR) access technology. The NR access technology may support enhanced mobile broadband (eMBB), massive machine type communications (mMTC), or ultra-reliable and low-latency communications (URLLC). The wireless communication module 192 may support a high-frequency band (e.g., the mmWave band) to achieve, e.g., a high data transmission rate. The wireless communication module 192 may support various technologies for securing performance on a high-frequency band, such as, e.g., beamforming, massive multiple-input and multiple-output (massive MIMO), full dimensional MIMO (FD-MIMO), array antenna, analog beam-forming, or large scale antenna. The wireless communication module 192 may support various requirements specified in the electronic device 101, an external electronic device (e.g., the electronic device 104), or a network system (e.g., the second network 199). According to an embodiment, the wireless communication module 192 may support a peak data rate (e.g., 20 Gbps or more) for implementing eMBB, loss coverage (e.g., 164 dB or less) for implementing mMTC, or U-plane latency (e.g., 0.5 ms or less for each of downlink (DL) and uplink (UL), or a round trip of 1 ms or less) for implementing URLLC.

The antenna module 197 may transmit or receive a signal or power to or from the outside (e.g., the external electronic device) of the electronic device 101. According to an embodiment, the antenna module 197 may include an antenna including a radiating element composed of a conductive material or a conductive pattern formed in or on a substrate (e.g., a printed circuit board (PCB)). According to an embodiment, the antenna module 197 may include a plurality of antennas (e.g., array antennas). In such a case, at least one antenna appropriate for a communication scheme used in the communication network, such as the first network 198 or the second network 199, may be selected, for example, by the communication module 190 (e.g., the wireless communication module 192) from the plurality of antennas. The signal or the power may then be transmitted or received between the communication module 190 and the external electronic device via the selected at least one antenna. According to an embodiment, another component (e.g., a radio frequency integrated circuit (RFIC)) other than the radiating element may be additionally formed as part of the antenna module 197.

According to various embodiments, the antenna module 197 may form a mmWave antenna module. According to an embodiment, the mmWave antenna module may include a printed circuit board, a RFIC disposed on a first surface (e.g., the bottom surface) of the printed circuit board, or adjacent to the first surface and capable of supporting a designated high-frequency band (e.g., the mmWave band), and a plurality of antennas (e.g., array antennas) disposed on a second surface (e.g., the top or a side surface) of the printed circuit board, or adjacent to the second surface and capable of transmitting or receiving signals of the designated high-frequency band.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 101 and the external electronic device 104 via the server 108 coupled with the second network 199. Each of the electronic devices 102 or 104 may be a device of a same type as, or a different type, from the electronic device 101. According to an embodiment, all or some of operations to be executed at the electronic device 101 may be executed at one or more of the external electronic devices 102, 104, or 108. For example, if the electronic device 101 should perform a function or a service automatically, or in response to a request from a user or another device, the electronic device 101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 101. The electronic device 101 may provide the outcome, with or without further processing of the outcome, as at least part of a reply to the request. To that end, a cloud computing, distributed computing, mobile edge computing (MEC), or client-server computing technology may be used, for example. The electronic device 101 may provide ultra low-latency services using, e.g., distributed computing or mobile edge computing. In another embodiment, the external electronic device 104 may include an internet-of-things (IoT) device. The server 108 may be an intelligent server using machine learning and/or a neural network. According to an embodiment, the external electronic device 104 or the server 108 may be included in the second network 199. The electronic device 101 may be applied to intelligent services (e.g., smart home, smart city, smart car, or healthcare) based on 5G communication technology or IoT-related technology.

According to an embodiment, the display module 160 shown in FIG. 1 may include a flexible display configured to be folded or unfolded.

According to an embodiment, the display module 160 shown in FIG. 1 may include a flexible display that is slidably disposed to provide a screen (e.g., a display screen).

For example, a display area of the electronic device 101 is an area that is visually exposed to output an image, and the electronic device 101 may adjust the width of the display area according to movement of a housing (e.g., the second housing 220 in FIG. 2A) or movement of the display. An example of an electronic device including the display module 160 may be a rollable electronic device configured such that at least a portion (e.g., a housing) of the electronic device 101 is operated to be at least partially slidable, thereby promoting selective expansion of a display area. For example, the display module 160 may be referred to as a slide-out display or an expandable display.

Figure 2A:
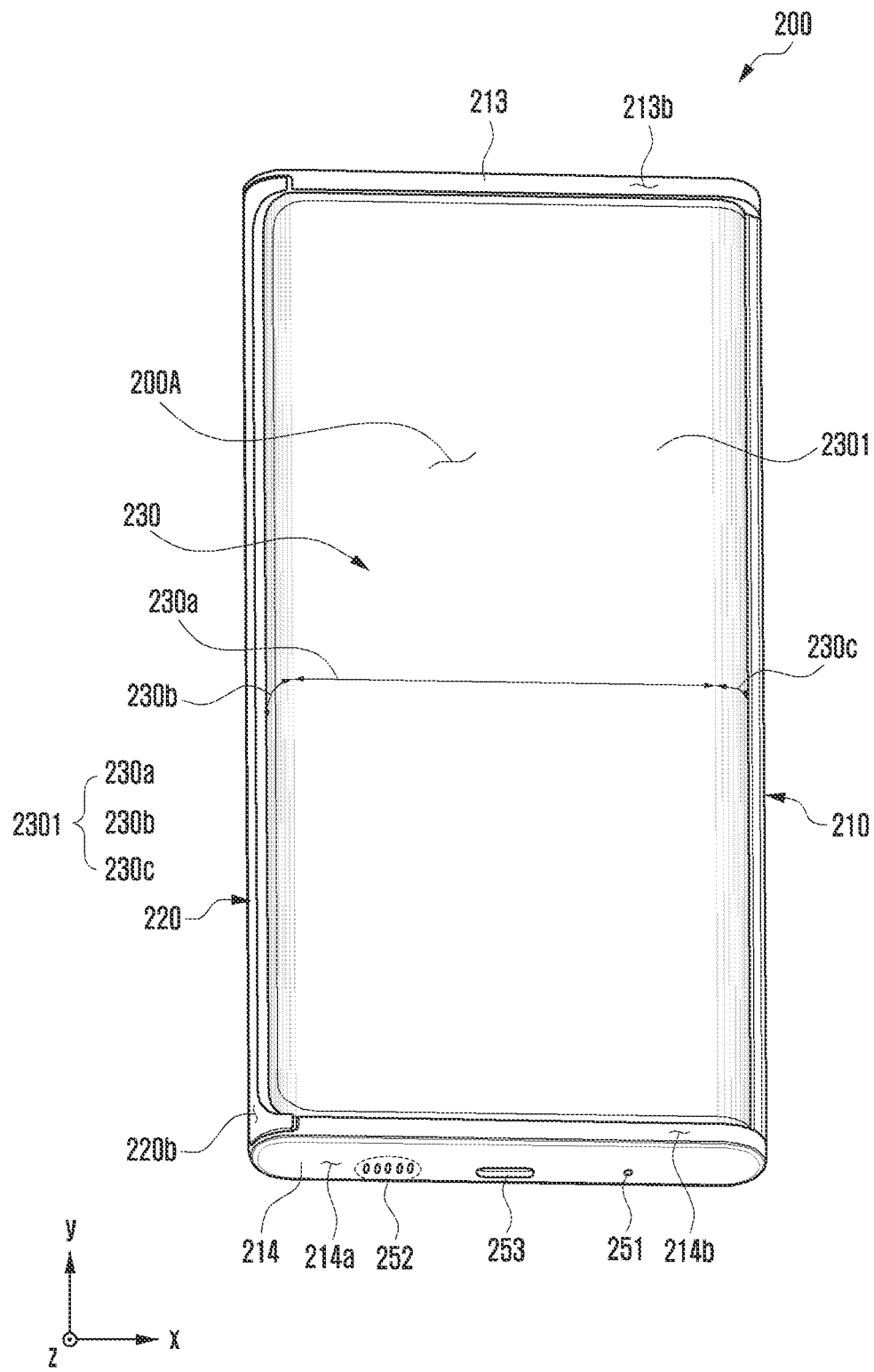
FIG. 2A is a front perspective view of an electronic device illustrating a first state (e.g., a closed state or a slide-in state) according to an embodiment of the disclosure.
Figure 2B:
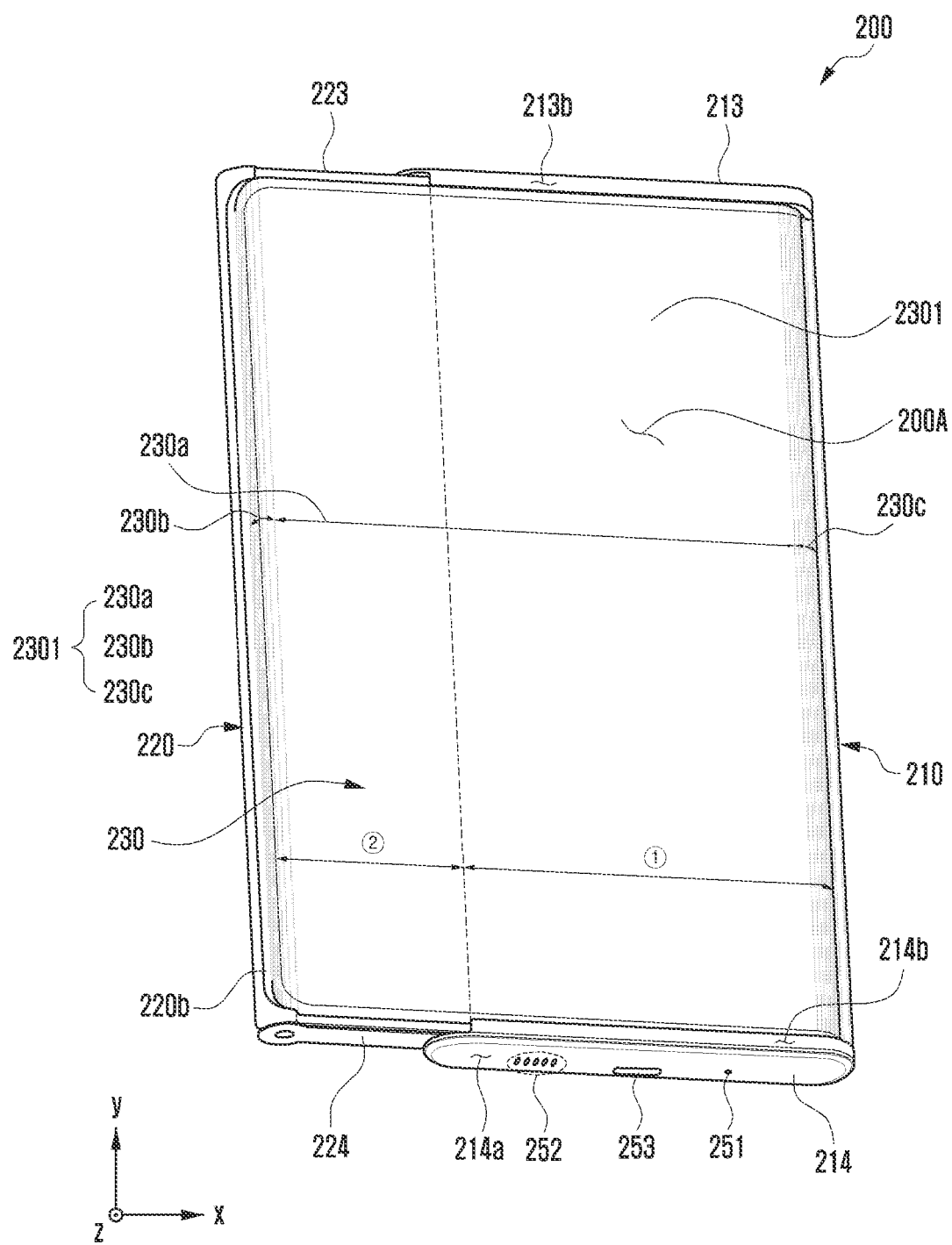
FIG. 2B is a front perspective view of an electronic device illustrating a second state (e.g., an open state or a slide-out state) according to an embodiment of the disclosure.

FIG. 2A is a front perspective view of an electronic device illustrating a first state (e.g., a closed state or a slide-in state) according to an embodiment of the disclosure. FIG. 2B is a front perspective view of an electronic device illustrating a second state (e.g., an open state or a slide-out state) according to an embodiment of the disclosure.

The electronic device 200 illustrated in FIGS. 2A and 2B may be at least partially similar to the electronic device 101 in FIG. 1, or may further include other embodiments of the electronic device.

Referring to FIGS. 2A and 2B, the electronic device 200 may include a first housing 210, a second housing 220, and a flexible display 230. In an embodiment, the electronic device 200 may be implemented to expand the screen 2301 in a sliding manner. For example, the screen 2301 may include an area of the flexible display 230, which is exposed to the outside.

According to an embodiment, FIG. 2A shows the electronic device 200 in the state in which the screen 2301 is not expanded, and FIG. 2B shows the electronic device 200 in the state in which the screen 2301 is expanded. The state in which the screen 2301 is not expanded may be the state in which the second housing 220 does not slide out, and may be referred to as a first state, for example, a closed state, below. The state in which the screen 2301 is expanded may be the state in which the screen 2301 is maximally expanded and is no longer expanded by sliding-out of the second housing 220, and may be referred to as a second state, for example, an open state, below.

In an embodiment, sliding-out may indicate that the second housing 220 at least partially moves in a first direction (e.g., a −x axis direction) when the electronic device 200 switches from the closed state to the open state. The open state may be defined as the state in which the screen 2301 is expanded compared to the closed state, and provide various sizes of screens 2301 according to the movement position of the second housing 220.

In various embodiments, the state of the electronic device 200 may include a third state, for example, an intermediate state. The intermediate state may mean the state between the closed state in FIG. 2A and the open state in FIG. 2B. The screen 2301 may include an active area of the flexible display 230, which is visually exposed to output images, and the electronic device 200 may adjust the active area according to a change in the size of the screen 2301 of the flexible display 230 depending on the movement of the second housing 220. In the following description, the open state may indicate the state in which the screen 2301 is maximally expanded.

In various embodiments, the flexible display 230 slidably disposed on the electronic device 200 in FIG. 2A to provide the screen 2301 may be referred to as a "slide-out display", a "stretchable display", or an "expandable display".

In an embodiment, the electronic device 200 may include a sliding structure related to the flexible display 230. For example, when the second housing 220 is moved by a configured distance by an external force in order to change the size of the screen 2301 of the flexible display 230, switching from the closed state to the open state or from the open state to the closed state may be performed due to an elastic structure included in the sliding structure (e.g., a semi-automatic sliding operation) even without further external force. In another embodiment, when a signal is generated through an input device included in the electronic device 200, the electronic device 200 may switch from the closed state to the open state or from the open state to the closed state due to a driving device such as a motor or a hinge connected to the flexible display 230. For example, when a signal is generated through a hardware button or a software button provided through a screen, the electronic device 200 may switch from the closed state to the open state or from the open state to the closed state.

In another embodiment, when a signal is generated from various sensors such as a pressure sensor, the electronic device 200 may switch from the closed state to the open state or from the open state to the closed state. For example, when the electronic device 200 is carried or held by a hand, the electronic device 200 may detect, through a sensor, a squeeze gesture in which a portion (e.g., the palm or finger) of the hand presses a specified section of the electronic device 200, and may switch from the closed state to the open state or from the open state to the closed state in response thereto.

In an embodiment, the flexible display 230 may include a first section ① (or fixed section) and a second section ②. The first section ① (or fixed section) and the second section ② may be connected. The first section ① (or fixed section) may be fixed to the first housing 210 and/or at least one support member (e.g., the front case 330 in FIG. 3) included inside the first housing 210. When switching from the closed state in FIG. 2A to the open state in FIG. 2B, the second section ② connected to the first section ① may slide out due to the movement of the second housing 220, thereby expanding the screen (e.g., see the screen 2301 in FIG. 2B). The flexible display 230 may include the second section (or bendable section) ② (see FIG. 2B). The second section ② may include the expanded portion of the screen 2301 when the electronic device 200 switches from the closed state to the open state. When the electronic device 200 switches from the closed state to the open state, the second section ② may slide out of the inner space of the electronic device 200 to be visible to the outside, thereby expanding the screen

2301. When the electronic device 200 switches from the open state to the closed state, at least a portion of the second section ② may slide in the inner space of the electronic device 200, thereby contracting the screen 2301. As an embodiment, when the electronic device 200 switches from the open state to the closed state, at least a portion (e.g., the second section ② or the bendable section) of the flexible display 230 may be bent. When the electronic device 200 switches from the open state to the closed state, at least a portion of the second section ② may be bent and moved to the inner space (e.g., the inner space of the second housing 220). For example, the flexible display 230 may include a flexible substrate (e.g., a plastic substrate) that is formed of a polymer material including polyimide (PI) or polyester (PET).

As an embodiment, when switching from the open state in FIG. 2B to the closed state in FIG. 2A, the second section ② may at least partially enter the electronic device 200 due to the movement of the second housing 220, thereby contracting the screen (e.g., see the screen 2301 in FIG. 2A). In an embodiment, the roller (e.g., the roller 400 in FIG. 3, the roller 400 in FIG. 6, or the roller 400 in FIG. 7) may be positioned corresponding to the second section ①, and during the switching between the closed state in FIG. 2A and the open state in FIG. 2B, the roller (e.g., the roller 400 in FIG. 3, the roller 400 in FIG. 6, or the roller 400 of FIG. 7) may be rotated due to the movement of the second section ①.

In an embodiment, the first housing 210 may include a back cover (not shown), a first side cover 213, or a second side cover 214.

In an embodiment, the back cover (not shown) may form at least a portion of a rear surface (not shown) of the electronic device 200. In an embodiment, the back cover (not shown) may be substantially opaque. For example, the back cover (not shown) may be formed of coated or tinted glass, ceramic, polymer, metal (e.g., aluminum, stainless steel (STS), or magnesium), or a combination of at least two thereof.

In an embodiment, in the state (e.g., the closed state) in which the second section ② of the flexible display 230 slide in the inner space of the second housing 220, at least a portion of the second section ② may be disposed so as to be visible to the outside through at least a portion of the back cover (not shown). In this case, the back cover (not shown) may be formed of a transparent material and/or a translucent material.

In an embodiment, the first side cover 213 and the second side cover 214 may be positioned on opposite sides. For example, the first side cover 213 and the second side cover 214 may be on opposite sides of the flexible display 230 in a second direction (e.g., a y axis direction) perpendicular to the first direction (e.g., the −x axis direction) of the sliding-out of the second housing 220. The first side cover 213 may form at least a portion of a first side surface (not shown) of the electronic device 200, and the second side cover 214 may form at least a portion of a second side surface 214a of the electronic device 200, which faces in the opposite direction of the first side surface (not shown). The first side cover 213 may include a first edge portion 213b that extends from the edge of the first side surface (not shown). For example, the first edge portion 213b may form at least a portion of one side bezel of the electronic device 200. The second side cover 214 may include a second edge portion 214b that extends from the edge of the second side surface 214a. For example, the second edge portion 214b may form at least a portion of the opposite side bezel of the electronic device 200. In an embodiment, the surface of the first edge portion 213b, the surface of the second edge portion 214b, and the surface of the second housing 220 may be smoothly connected in the closed state in FIG. 2A, thereby forming one side curved portion (not shown) corresponding to a first curved portion 230b of the screen 2301. In an embodiment, the surface of the first edge portion 213b or the surface of the second edge portion 214b may include the opposite side curved portion (not shown) corresponding to a second curved portion 230c of the screen 2301, which is positioned opposite the first curved portion 230b.

In an embodiment, at least a portion of the flexible display 230 may be disposed in the second housing 220, and the closed state in FIG. 2A or the open state in FIG. 2B may be determined based on the position of the second housing 220 that moves based on the first housing 210.

In an embodiment, the second housing 220 may include a third side cover 223, a fourth side cover 224, and a third edge portion 220b.

In an embodiment, the third side cover 223 and the fourth side cover 224 may be positioned on opposite sides. For example, the third side cover 223 and the fourth side cover 224 may be on opposite sides of the flexible display 230 in the second direction (e.g., the y axis direction) perpendicular to the first direction (e.g., the −x axis direction) of the sliding-out of the second housing 220.

In an embodiment, the third edge portion 220b may form an outer surface of the electronic device 200 (e.g., the surface exposed to the outside to form the exterior of the electronic device 200). For example, the third edge portion 220b may form the bezel around the screen 2301 together with the first edge portion 213b and the second edge portion 214b in the closed state in FIG. 2A. The third edge portion 220b may extend in the second direction (e.g., the y axis direction) in order to connect one end of the first side cover 213 and one end of the second side cover 214 in the closed state. For example, the surface of the third edge portion 220b may be smoothly connected to the surface of the first edge portion 213b and/or the surface of the second edge portion 214b in the closed state in FIG. 2A.

In an embodiment, at least a portion of the second section ② may slide out of the inside of the electronic device 200 due to the sliding-out of the second housing 220, thereby providing the state (e.g., the open state) in which the screen 2301 is expanded as shown in FIG. 2B.

In an embodiment, in the closed state in FIG. 2A, the screen 2301 may include a flat portion 230a, and a first curved portion 230b and/or a second curved portion 230c that are positioned on opposite sides of the flat portion 230a. For example, the first curved portion 230b and the second curved portion 230c may be substantially symmetrical with respect to the flat portion 230a positioned therebetween. In an embodiment, when the closed state in FIG. 2A is switched to the open state in FIG. 2B, the flat portion 230a may be expanded. For example, a partial area of the second section ②, which forms the first curved portion 230b in the closed state in FIG. 2A, may be included in the flat portion 230a that expands when switching from the closed state in FIG. 2A to the open state in FIG. 2B.

In an embodiment, the electronic device 200 may include an opening (not shown) of the second section ② for sliding-in or sliding-out and/or a roller (e.g., the roller 400 in FIG. 3, the roller 400 in FIG. 6, or the roller 400 in FIG. 7) (or pulley) (not shown) positioned in the opening (not shown). The roller (e.g., the roller 400 in FIG. 3, the roller 400 in FIG. 6, or the roller 400 in FIG. 7) may be positioned corresponding to the second section ②, and when switching between the closed state in FIG. 2A and the open state in FIG. 2B, movement of the second section ② and the movement direction thereof may be guided through rotation of the roller (e.g., the roller 400 in FIG. 3, the roller 400 in FIG. 6, or the roller 400 in FIG. 7). The first curved portion 230b may be formed corresponding to the curved surface formed on one surface of the second housing 220. The first curved portion 230b may be formed by the portion corresponding to the curved surface of the roller (e.g., the roller 400 in FIG. 3, the roller 400 in FIG. 6, or the roller 400 in FIG. 7) in the second section ②. In another embodiment, the electronic device 200 may be implemented as a form in which the flat portion 230a is expanded without the second curved portion 230c.

In an embodiment, the flexible display 230 may further include a touch detection circuit (e.g., a touch sensor). Although not shown, in various embodiments, the flexible display 230 may be combined with or disposed adjacent to a pressure sensor capable of measuring the intensity (pressure) of a touch and/or a digitizer for detecting a pen input device (e.g., a stylus pen) in a magnetic field type. For example, the digitizer may include a coil member that is disposed on a dielectric substrate in order to detect a resonance frequency in an electromagnetic induction type, which is applied from a pen input device.

In an embodiment, the electronic device 200 may include a microphone hole 251 (e.g., the input module 150 in FIG. 1), a speaker hole 252 (e.g., the sound output module 155 in FIG. 1), and/or a connector hole 253 (e.g., the connection terminal 178 in FIG. 1). In some embodiments, the electronic device 200 may exclude at least one of the elements, or may further include other elements.

In an embodiment, the microphone hole 251 may be formed on at least a portion of the second side surface 214a so as to correspond to the microphone (not shown) positioned inside the electronic device 200. The position of the microphone hole 251 is not limited to the embodiment in FIG. 2A, and may vary. In an embodiment, the electronic device 200 may include a plurality of microphones capable of detecting the direction of sound.

In an embodiment, the speaker hole 252 may be formed on at least a portion of the second side surface 214a so as to correspond to a speaker (not shown) positioned inside the electronic device 200. The position of the speaker hole 252 is not limited to the embodiment in FIG. 2A, and may vary. In various embodiments, the electronic device 200 may include call receiver hole. In some embodiments, the microphone hole 251 and the speaker hole 252 may be implemented as one hole, or the speaker hole 252 may be omitted like a piezo speaker.

In an embodiment, the connector hole 253 may be formed on at least a portion of the second side surface 214a so as to correspond to a connector (e.g., a USB connector) positioned inside the electronic device 200. The electronic device 200 may transmit and/or receive power and/or data to and/or from an external electronic device that is electrically connected to the connector through the connector hole 253. The position of the connector hole 253 is not limited to the embodiment in FIG. 2A, and may vary.

Although not shown, in various embodiments, the electronic device 200 may include a camera module (e.g., a front camera) that produces an image signal, based on the light received through one surface (e.g., the front surface 200A) of the electronic device 200 that is positioned in the direction in which the screen 2301 faces. For example, the camera module (e.g., the front camera) (not shown) may be positioned inside the first housing 210 while being aligned with the opening (e.g., a through-hole or a notch) formed in the flexible display 230. The camera module (e.g., the front camera) (not shown) may receive light through an opening and a portion of a transparent cover that overlaps the opening, thereby producing an image signal. The transparent cover may serve to protect the flexible display 230 from the outside, and include a material such as polyimide or ultra-thin glass (UTG).

In various embodiments, the camera module (e.g., the front camera) (not shown) may be disposed at the lower end of at least a portion of the screen 2301 of the flexible display 230, and perform related functions (e.g., an image shooting) while the position of the camera module (e.g., the front camera) (not shown) is not visually distinguished (or exposed). In this case, when viewed from above the screen 2301, the camera module (e.g., the front camera) (not shown) may be disposed to overlap at least a portion of the screen 2301 to obtain the image of an external subject without being exposed to the outside. In an embodiment, as a portion of the area that displays the content, the area of the flexible display 230, which faces the camera module, is a portion of the area displaying content, and may be formed as a transmissive area having a specified transmittance. According to an embodiment, the transmissive area may be formed to have a transmittance in the range of about 5% to about 20%. The transmissive area may include an area that overlaps the effective area (e.g., the angle-of-view area) of the camera module through which light to be received by an image sensor and produce an image passes. For example, the transmissive area of the flexible display 230 may include an area having a lower pixel density and/or wiring density than the surrounding area. For example, the transmissive area may replace the opening described above. For example, some of the camera modules may include an under display camera (UDC).

Although not shown, in various embodiments, the electronic device 200 may further include a key input device (e.g., the input module 150 in FIG. 1). The key input device may be positioned on the first side surface (not shown) of the electronic device 200, which is formed by the first side cover 213. In various embodiments, the key input device may include at least one sensor module.

Although not shown, in various embodiments, the electronic device 200 may include various sensor modules (e.g., the sensor module 176 in FIG. 1). The sensor module may produce an electrical signal or a data value corresponding to the internal operation state of the electronic device 200 or the external environmental state. For example, the sensor module may include a proximity sensor for producing a signal regarding proximity of an external object, based on the light received through the front surface 200A of the electronic device 200, which is disposed in the direction in which the screen 2301 faces. For another example, the sensor module may include various biometric sensors such as a fingerprint sensor or an HRM sensor for detecting biometric information, based on the light received through the front surface 200A or rear surface (not shown) of the electronic device 200. The electronic device 200 may include at least one of various other sensor modules, for example, a gesture sensor, a gyro sensor, an atmospheric pressure sensor, a magnetic sensor, an acceleration sensor, a grip sensor, a color sensor, an infrared (IR) sensor, a biometric sensor, a temperature sensor, a humidity sensor, or an illuminance sensor.

Figure 3:
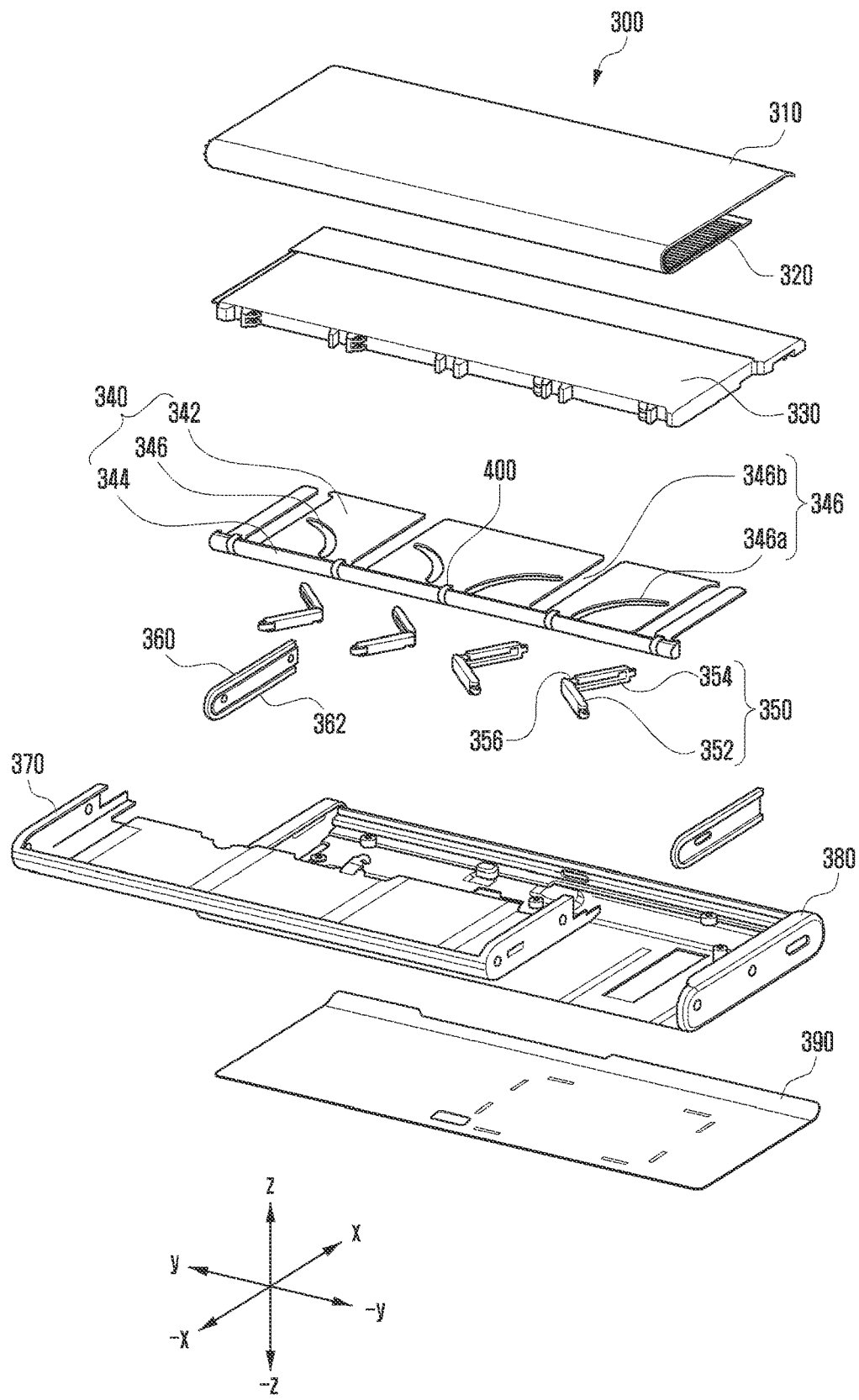
FIG. 3 is an exploded perspective view of an electronic device according to an embodiment of the disclosure.

FIG. 3 is an exploded perspective view of an electronic device according to an embodiment of the disclosure.

Figure 4A:
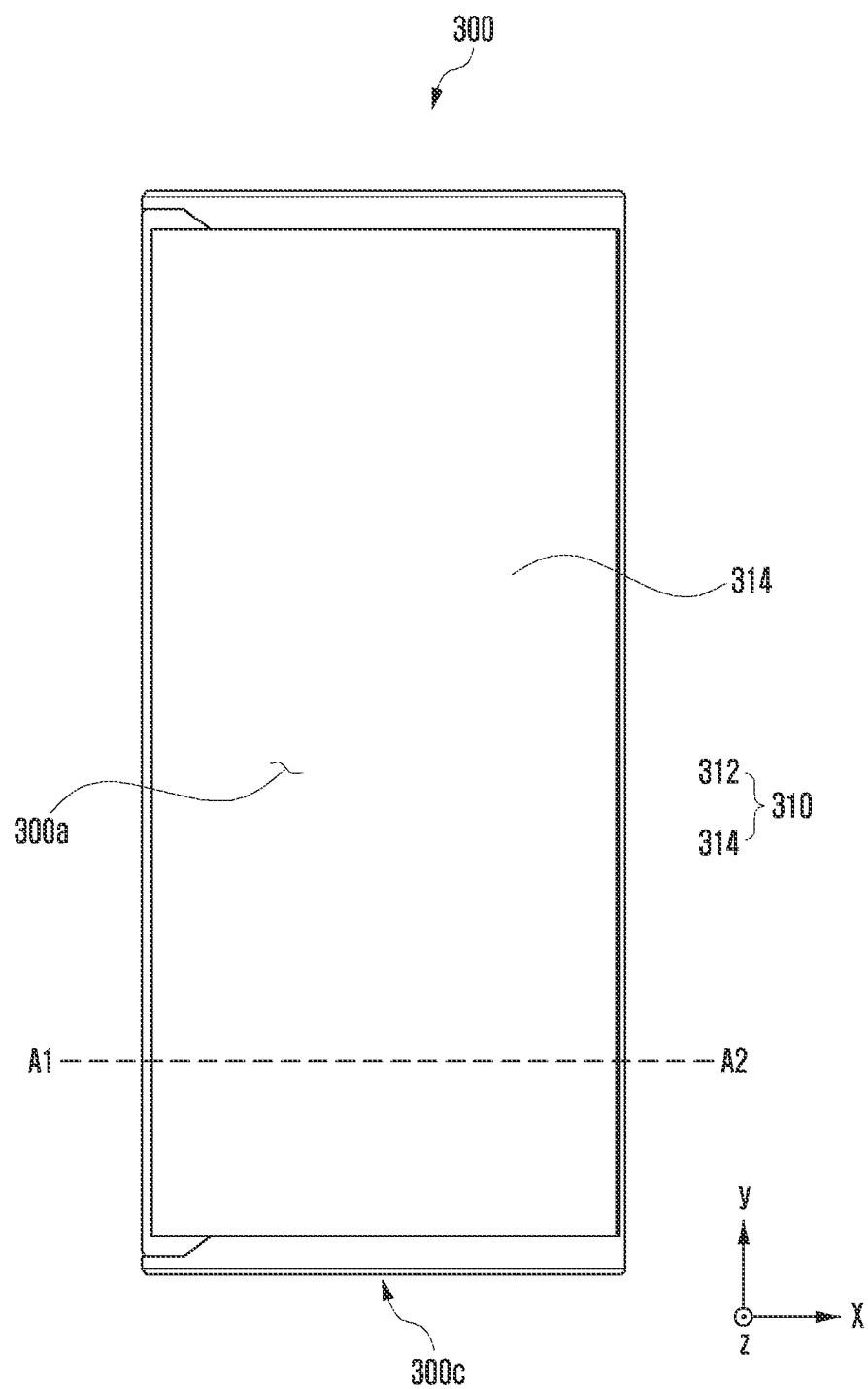
FIG. 4A is a view illustrating a front surface (e.g., a surface on which a screen is displayed) of an electronic device in a first state (e.g., a closed state) according to an embodiment of the disclosure.
Figure 4B:
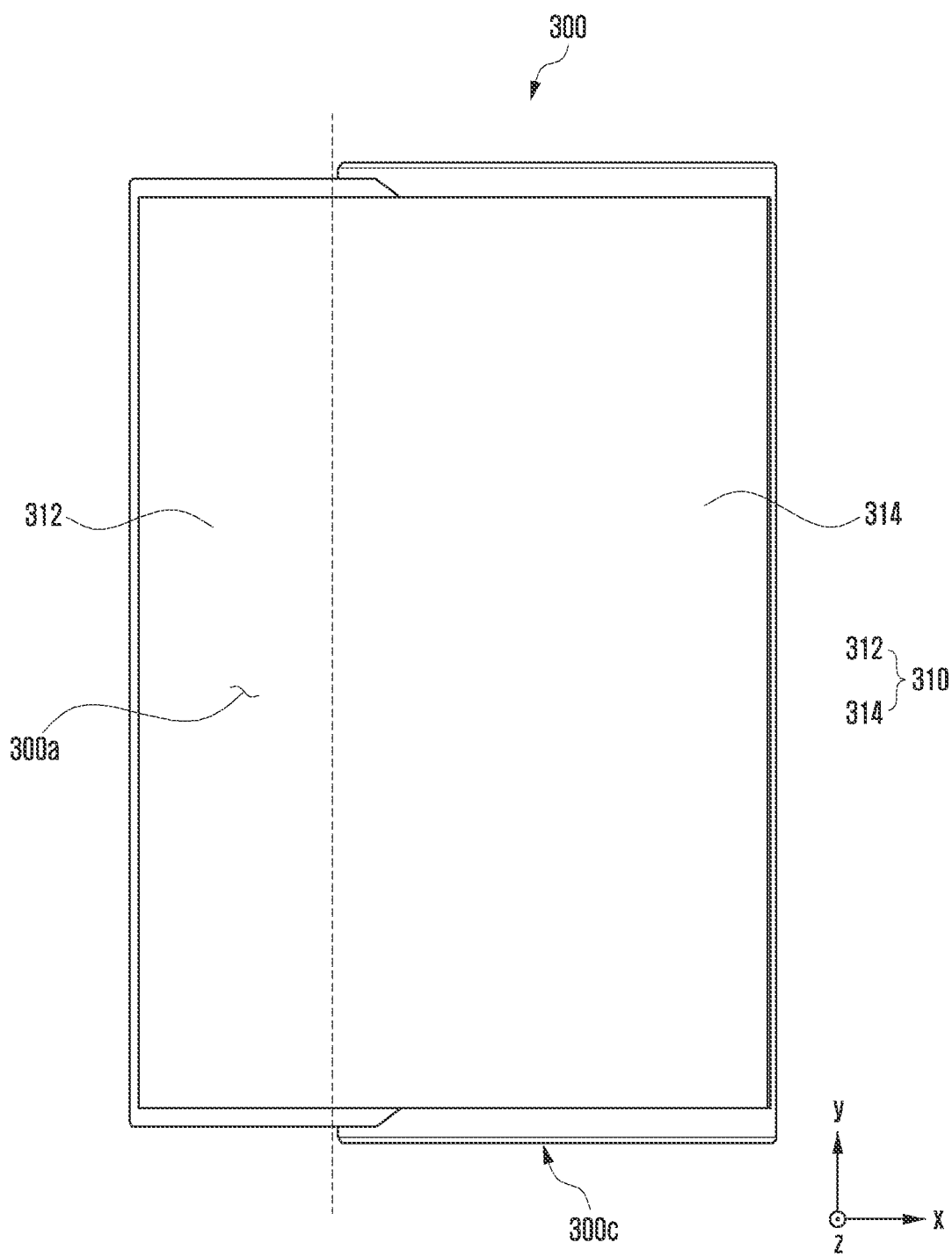
FIG. 4B is a view illustrating a front surface (e.g., a surface on which a screen is displayed) of an electronic device in a second state (e.g., an open state) according to an embodiment of the disclosure.
Figure 4C:
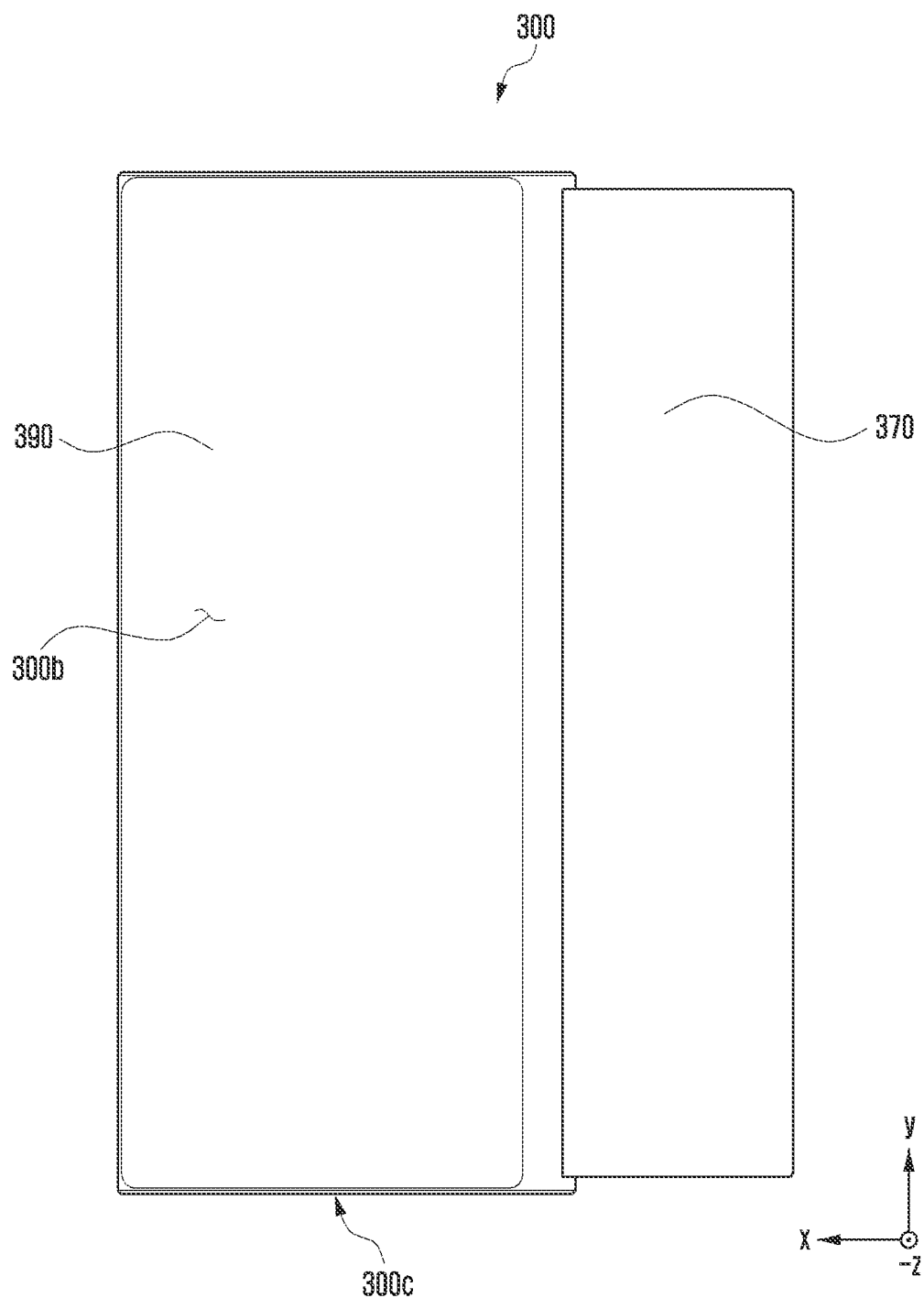
FIG. 4C is a view illustrating a rear surface of an electronic device in a second state (e.g., an open state) according to an embodiment of the disclosure.
Figure 4D:
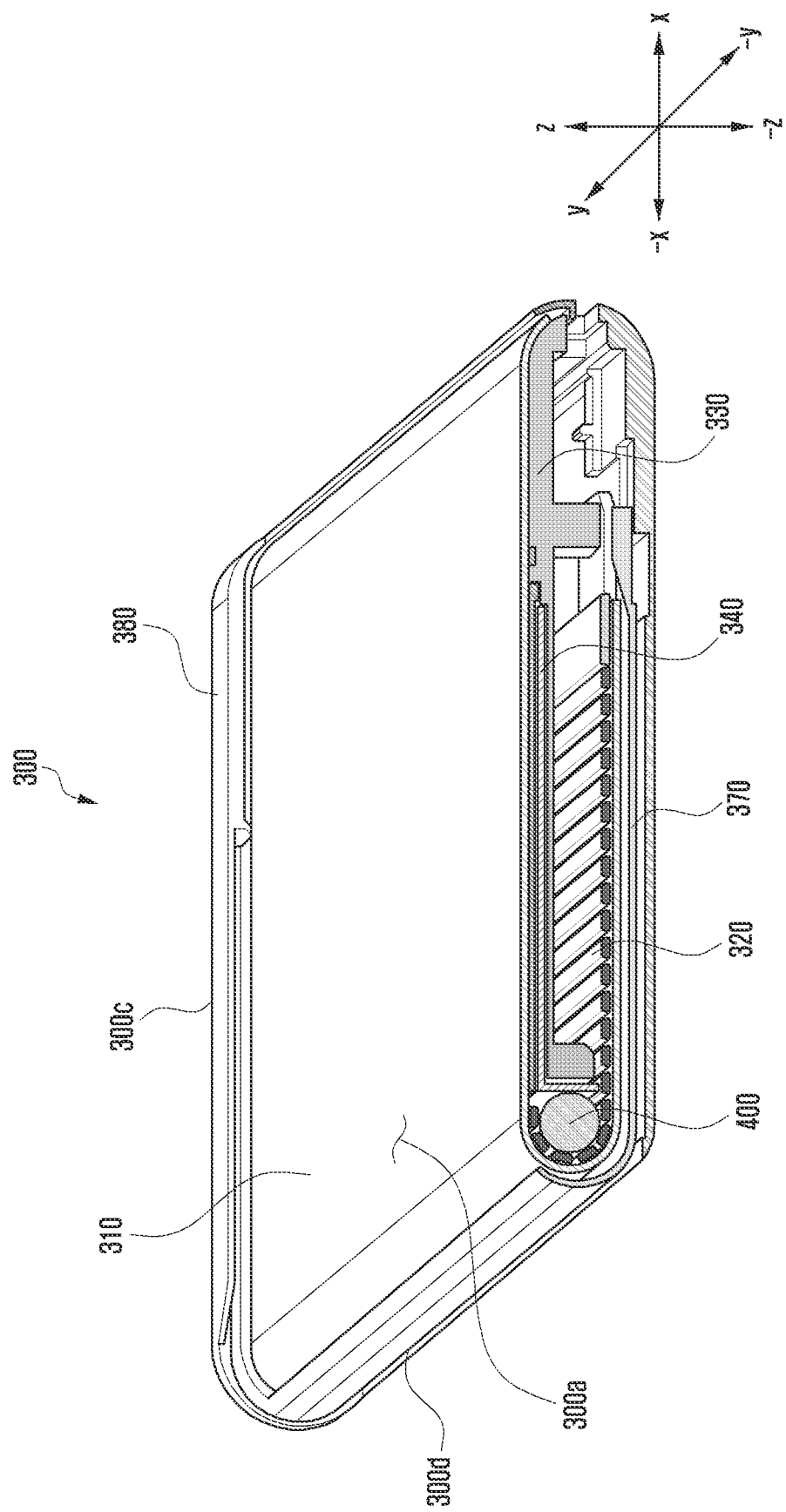
FIG. 4D is a cross-sectional perspective view of an electronic device taken along line A1-A2 in FIG. 4A according to an embodiment of the disclosure.
Figure 6:
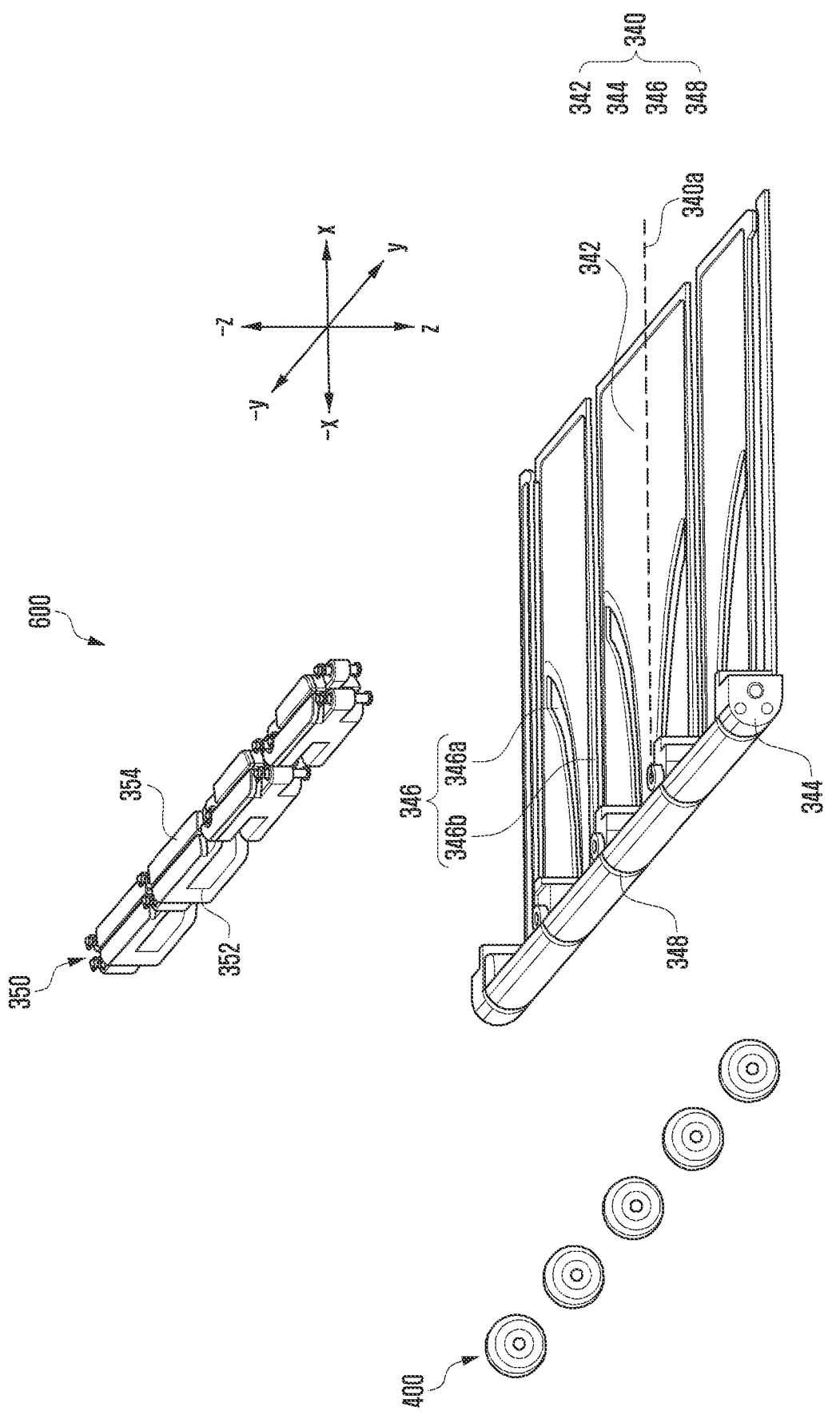
FIG. 6 is a view illustrating a sliding frame module of an electronic device according to an embodiment of the disclosure.
Figure 7:
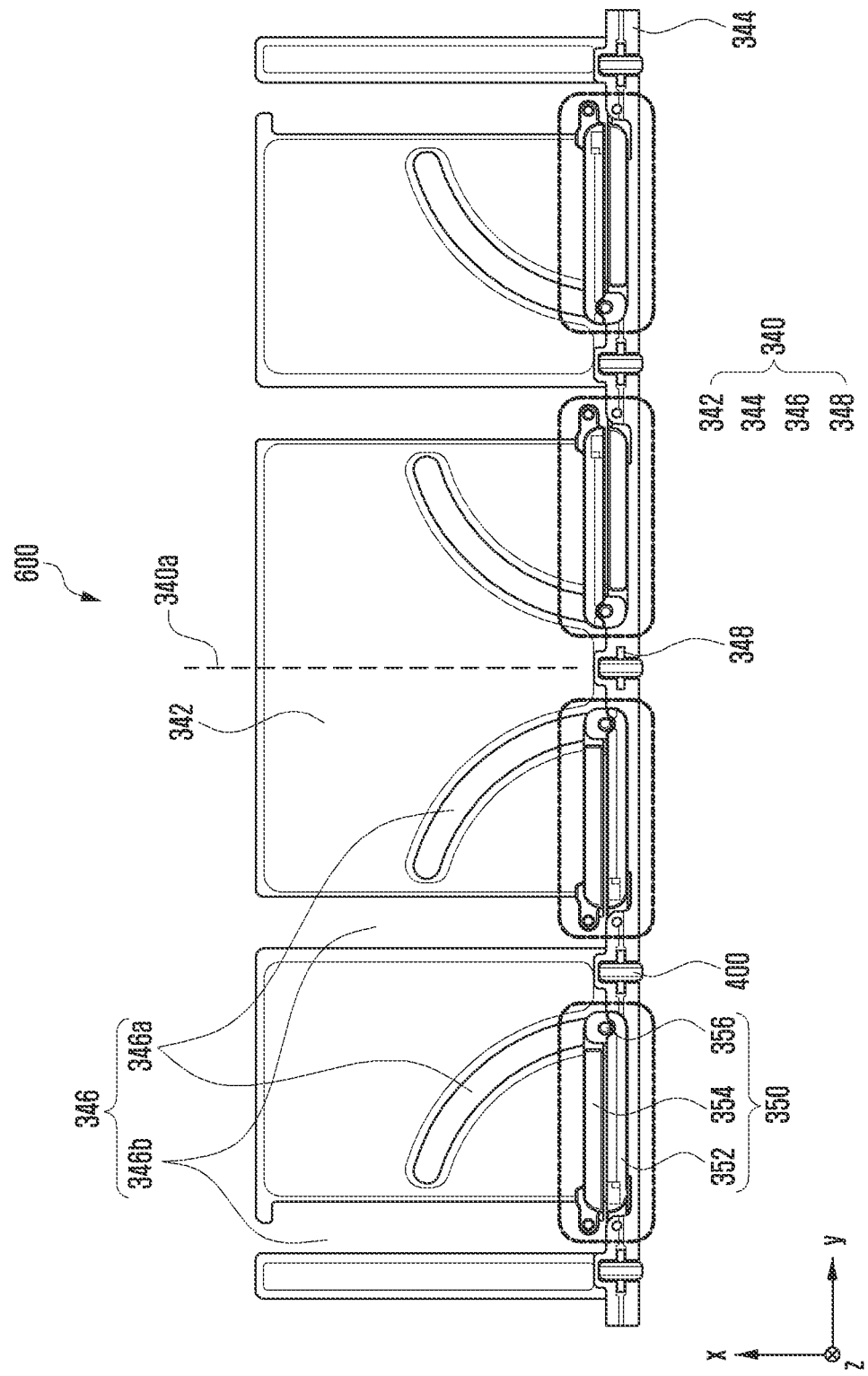
FIGS. 7 and 8 are views showing that a driving body is coupled to a sliding frame and that a roller is coupled to a sliding bar according to various embodiments of the disclosure.

Referring to FIG. 3, an electronic device 300 (e.g., the electronic device 200 in FIGS. 2A and 2B) according to various embodiments of disclosure may include a flexible display 310 (e.g., the flexible display 230 in FIGS. 2A and 2B), a bendable member 320 (e.g., a multi-bar assembly), a front case 330, a sliding frame 340, a driving body 350, a guide rail 360, a first housing 380 (e.g., the first housing 210 in FIGS. 2A and 2B), a second housing 370 (e.g., the second housing 220 in FIGS. 2A and 2B), a back cover 390 (e.g., a back glass), and a roller 400 (e.g., the roller 400 in FIG. 4D, the roller 400 in FIG. 6, or the roller 400 in FIG. 7). In addition, the electronic device 300 according to various embodiments of the disclosure may have an inner space provided by the front case 330 and the first housing 380, and include a battery (e.g., the battery 188 of FIG. 1) and a printed circuit board that are disposed in the inner space. At least some of the processor 120, the memory 130, the input module 150, the sound output module 155, the audio module 170, the sensor module 176, the interface 177, and the connection terminal 178, the haptic module 179, the camera module 180, the power management module 188, and the communication module 190, which are shown in FIG. 1, and/or other components of the electronic device 300 may be disposed in the printed circuit board.

According to an embodiment, the flexible display 310 may be formed of a flexible material to be rolled up, and display an image according to an input image signal. The flexible display 310 may include a fixed section (e.g., the first section ① in FIG. 2B) that is exposed to the outside when the screen (e.g., the screen 2301 in FIGS. 2A and 2B) is in a contracted state (e.g., the closed state in FIG. 2A) and a bendable section (e.g., the second section ② in FIG. 2B) that is exposed to the outside when the screen 2301 is in an expanded state (e.g., the open state in FIG. 2B).

According to an embodiment, the bendable member 320 may include a plurality of guide bars (e.g., the plurality of guide bars 322 in FIG. 5B) that are rotatably combined with each other to enable the rolling operation of the flexible display 310. The bendable member 320 may be attached to at least a portion of the rear surface of the flexible display 310 using an adhesive (e.g., a thermally reactive adhesive member, a photoreactive adhesive member, a general adhesive, and/or a double-sided tape), and the plurality of guide bars (e.g., the plurality of guide bars 322 in FIG. 5B) of the bendable member 320 may be disposed to have a predetermined gap therebetween. The bendable member 320 may support the bendable section (e.g., the bendable section ② in FIG. 2B) such that the bendable section (e.g., the bendable section ② in FIG. 2B) of the flexible display 310 may be maintained to be smoothly connected with the fixed section (e.g., the fixed section ① of FIG. 2B) of the flexible display 310.

According to an embodiment, although not shown, the electronic device 300 may further include a support plate (not shown) that is connected to the bendable member 320. For example, the support plate (not shown) may be connected to guide bar that is disposed in the outermost end of the plurality of guide bars (e.g., the plurality of guide bars 322 in FIG. 5B) in order to support the fixed section (e.g., the fixed section ① in FIG. 2B).

According to an embodiment, the front case 330 may support at least a portion of the flexible display 310 through an upper surface thereof, and provide a space in order for the electronic components such as a battery (e.g., the battery 188 in FIG. 1) or a printed circuit board to be disposed.

According to an embodiment, the sliding frame 340 may include a slide plate 342 and a sliding bar 344. The sliding frame 340 may be integrally formed with the sliding bar 344. In some embodiments, the sliding frame 340 may be formed to be separate from the sliding bar 344, and may be structurally coupled thereto. A plurality of guide slits 346 may be included in the slide plate 342. Some guide slits 346b among the plurality of guide slits 346 may be formed by cutting a portion of the slide plate 342 to have a predetermined width, and the remaining guide slits 346a may be formed such that a portion of the driving body 350 is inserted thereto to be guided. The plurality of guide slits 346 may include a plurality of first guide slits 346a having a predetermined curvature and a plurality of second guide slits 346b having a linear shape. A driving shaft (e.g., the driving shaft 356 in FIG. 9) of the driving body 350 may be inserted into the plurality of first guide slits 346a. For example, the driving shaft 356 may move along the curve formed to have a curvature in the plurality of the first guide slits 346a according to folding and unfolding of the driving body 350. In addition, a first link portion (e.g., the first link portion 352a in FIG. 12A) and a second link portion (e.g., the second link portion 354a in FIG. 12A) of the driving body 350 may be at least partially inserted into the plurality of the second guide slits 356b. The first link portion 352 and the second link portion 354 may move along the second guide slit 346b according to folding or unfolding of the driving body 350.

According to an embodiment, the sliding frame 340 may slide in the x axis direction and the −x axis direction according to movement of the driving body 350 and/or the second housing 370, and expand or contract a screen (e.g., the screen 2301 in FIG. 2B) of the flexible display 310. For example, the sliding frame 340 may push the bendable member 320 in the −x axis direction to expand the screen (e.g., the screen 2301 in FIG. 2B) of the flexible display 310. Alternatively, in the expanded state (e.g., the open state) of the screen (e.g., the screen 2301 in FIG. 2B), when the second housing 370 is moved in the x axis direction by an external force, the sliding frame 340 may push the bendable member 320 in the x axis direction to contract the screen (e.g., the screen 2301 in FIG. 2B) of the flexible display 310. The sliding frame 340 may support at least a portion of the bendable member 320 in a curved portion 300d (e.g., the first curved portion 230b in FIGS. 2A and 2B or the curved portion 300d in FIG. 4D). In addition, when the screen (e.g., the screen 2301 in FIG. 2B) of the flexible display 310 expands, the sliding frame 340 may support the bendable member 320 in a flat area (e.g., the flat area in FIGS. 2A and 2B) other than the curved portion 300d.

According to an embodiment, the roller 400 may be inserted into a roller hole (e.g., the roller hole 348 in FIG. 6) that is formed at regular intervals in the sliding bar 344. The roller 400 may be self-rotatably coupled to the roller hole. Accordingly, when the sliding frame 340 moves from the closed state to the open state or from the open state to the closed state, the contact-frictional force between the bendable member 340 and the slide bar 344 may be reduced through the rotatable roller 400 in contact with at least a portion of the bendable member 340.

Figure 12A:
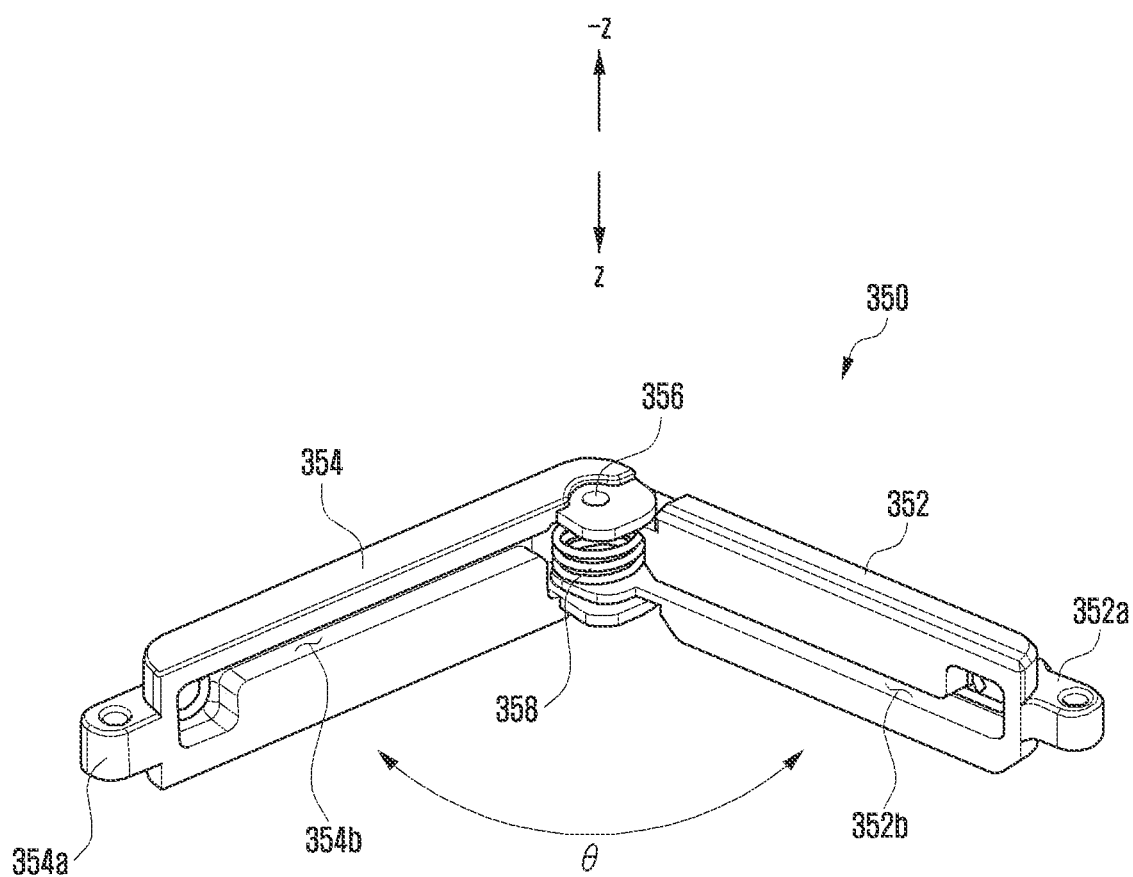
FIG. 12A is a diagram illustrating a driving body of an electronic device according to an embodiment of the disclosure.
Figure 12B:
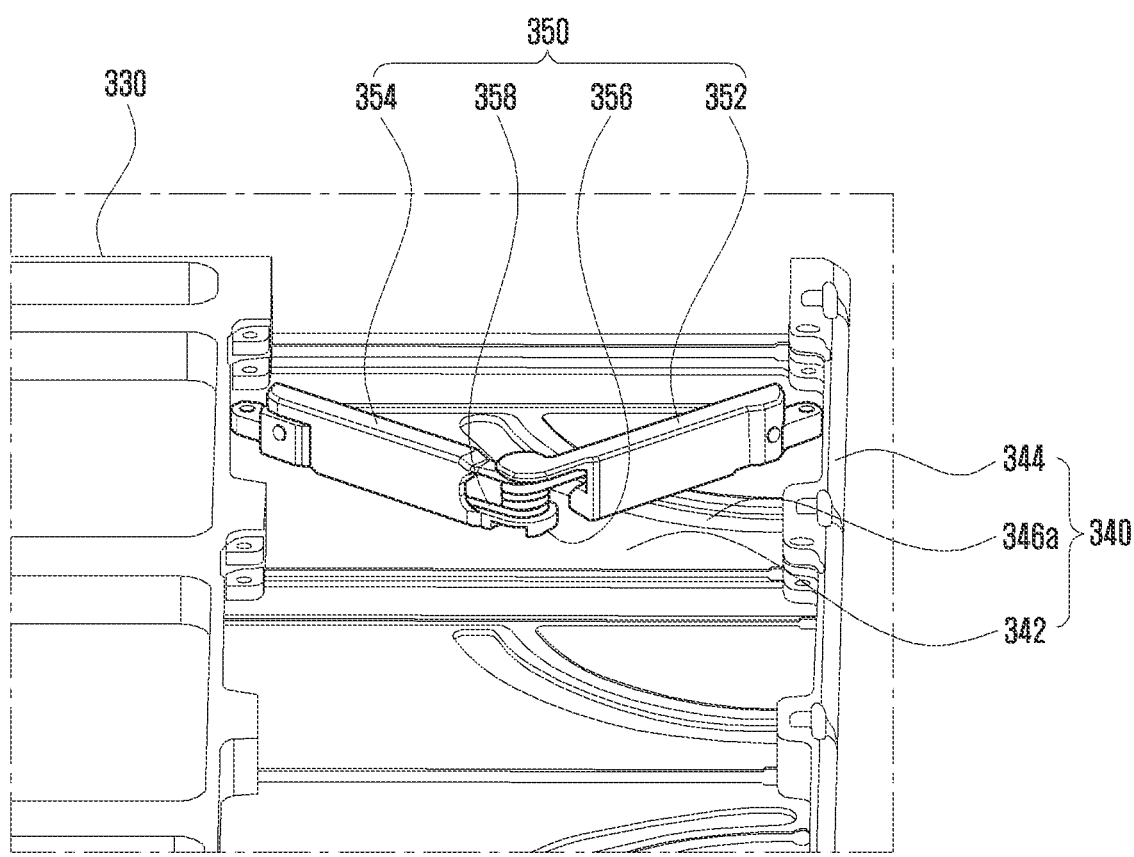
FIGS. 12B, 12C, 12D, 12E, and 12F are views illustrating a coupling structure between a sliding frame and a driving body and a coupling structure between a driving body and a front case according to various embodiments of the disclosure.
Figure 12C:
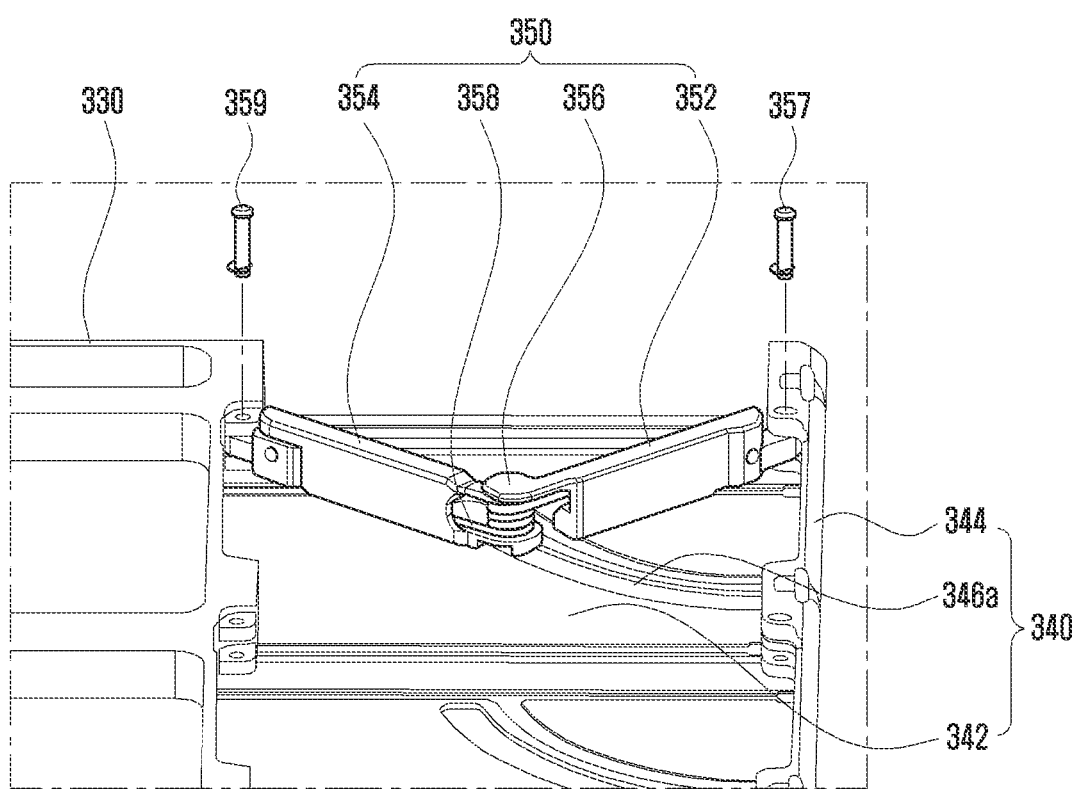
Figure 12D:
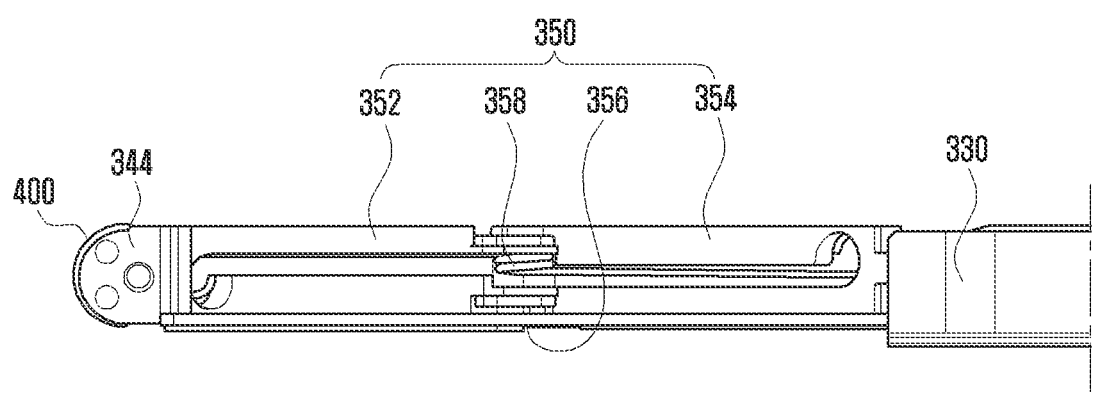
Figure 12E:
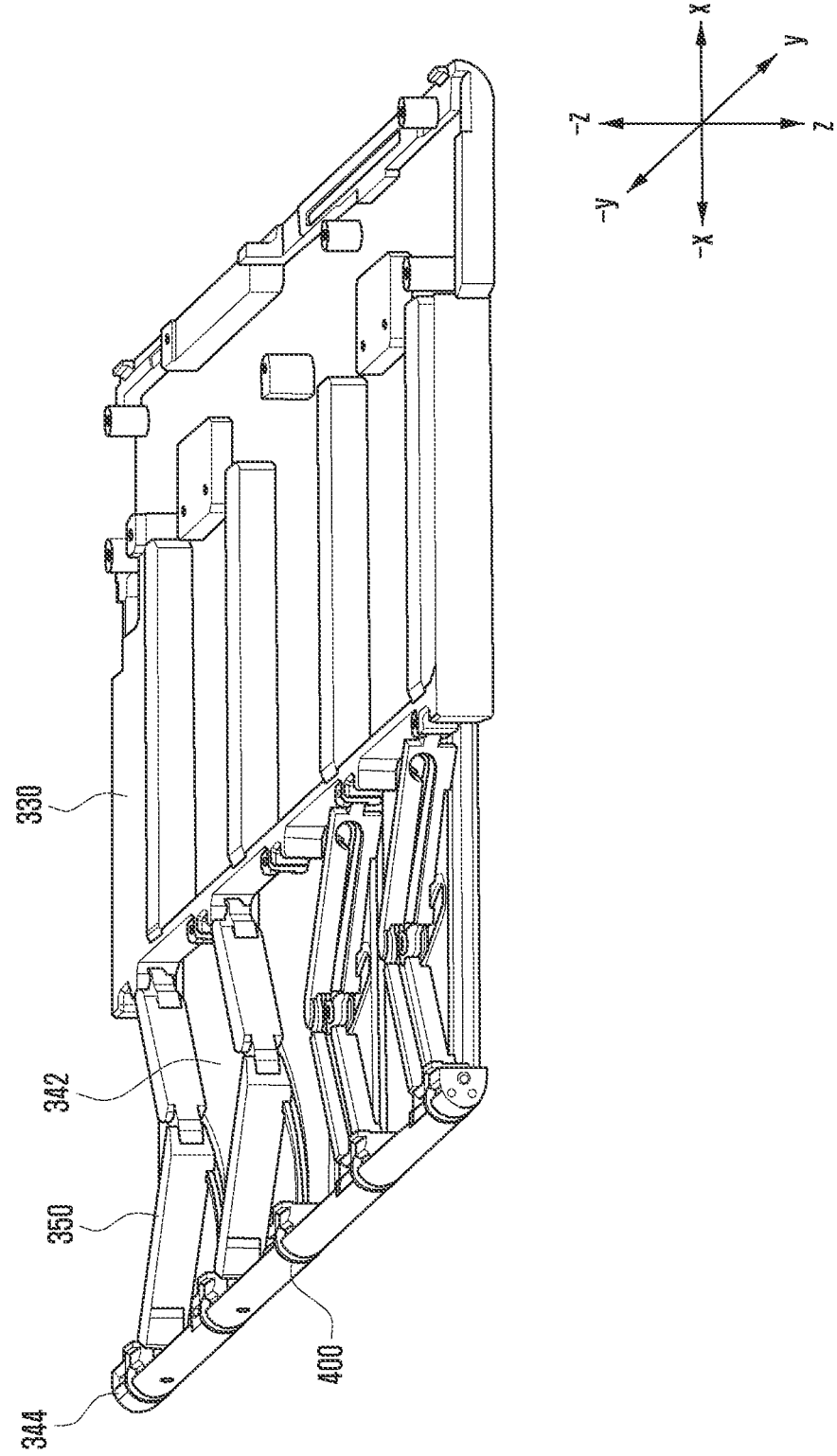
Figure 12F:
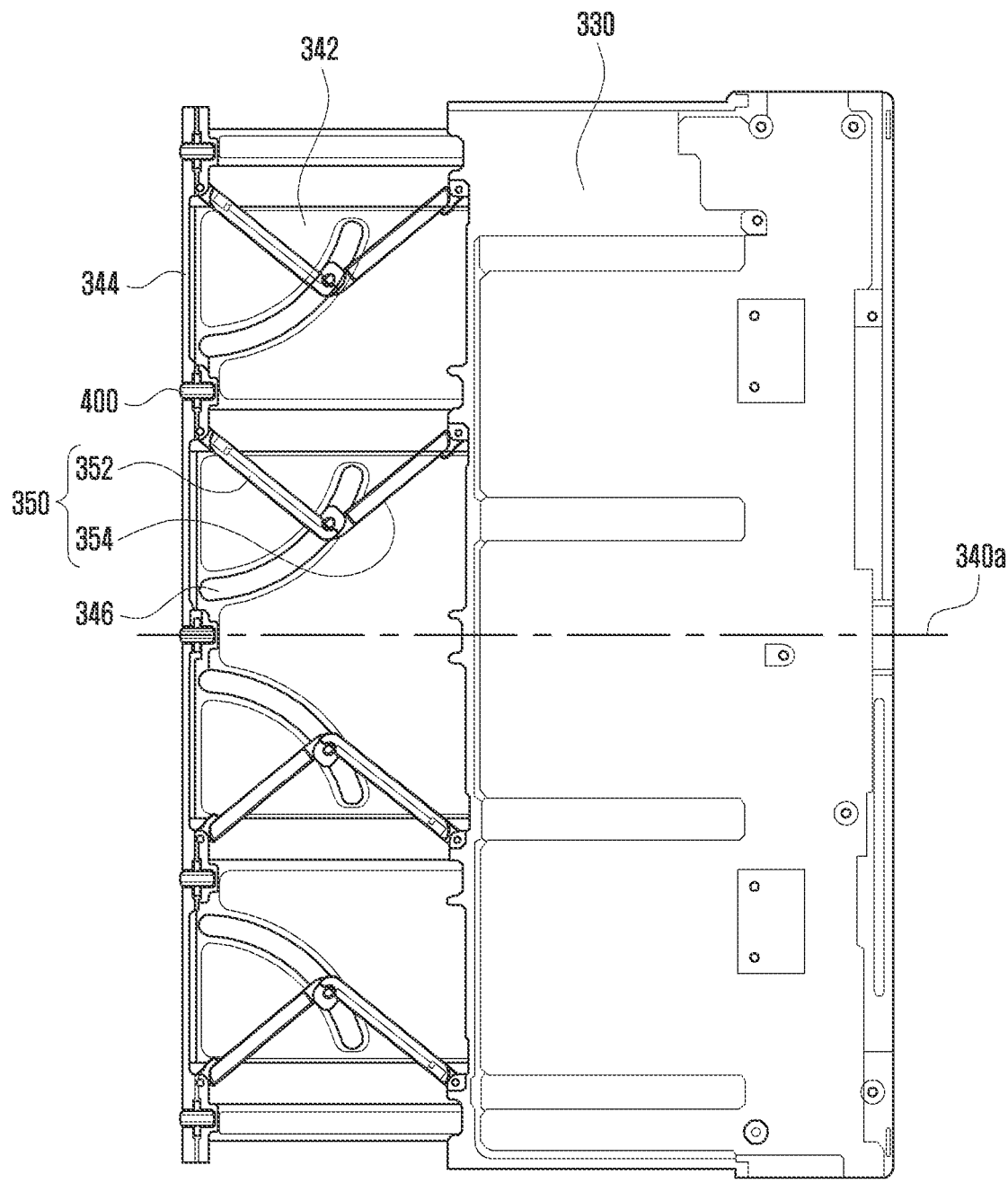

According to an embodiment, the driving body 350 may include a first driving bar 352, a second driving bar 354, a driving shaft 356, and an elastic member (e.g., the elastic member 358 in FIGS. 12A and 12B). The first driving bar 352 and the second driving bar 354 may be coupled by the driving shaft 356, and the first driving bar 352 and the second driving bar 354 may pivot to each other with respect to the driving shaft 356. The elastic member (e.g., the elastic member 358 in FIGS. 12A and 12B) may provide an elastic force enabling the first driving bar 352 and the second driving bar 354 to be unfolded. For example, the first driving bar 352 and the second driving bar 354 may be unfolded by a specified angle by the elastic member (e.g., the elastic member 358 in FIGS. 12A and 12B) in the case where no external force is applied. In an embodiment, the elastic member (e.g., the elastic member 358 in FIGS. 12A and 12B) may include a torsion spring. In some embodiments, the first driving bar 352 and the second driving bar 354 may have an angle limit structure that prevents the first driving bar 352 and the second driving bar 354 from being unfolded at a specified angle or more through the elastic member (e.g., the elastic member 358 in FIGS. 12A and 12B). The angle limit structure may include a locking protrusion and a locking portion that are formed on the first driving bar 352 and the second driving bar 354. The driving body 350 may be disposed such that the first driving bar 352 is rotatably coupled to the sliding frame 340 and such that the second driving bar 354 is rotatably coupled to the front case 330. The disclosure is not limited thereto, and the first driving bar 352 of the driving body 350 may be coupled to the front case 330, and the second driving bar 354 may be coupled to the sliding frame 340.

For example, in order to provide a fastening force (or a fixing force) against the elastic force of the elastic member (e.g., the elastic member 358 in FIGS. 12A and 12B), the electronic device 300 may include a locking device (e.g., the locking device 382 in FIGS. 15 and 16) that is disposed on the rear surface (e.g., the surface opposite the surface on which the flexible display 310 is disposed) of the first housing 380, and a locking jaw (e.g., the locking jaw 372 in FIGS. 16 and 17) that is formed on the rear surface (e.g., the surface opposite the surface on which the flexible display 310 is disposed) of the second housing 370. It is possible to suppress the state change of the electronic device 300 due to the elastic force of the elastic member (e.g., the elastic member 358 in FIGS. 12A and 12B) using the locking device (e.g., the locking device 382 in FIGS. 15 and 16) and the locking jaw (e.g., the locking jaw 372 in FIGS. 16 and 17). For example, the first driving bar 352 and the second driving bar 354 may remain in the folded state through the locking structure in which the locking device is engaged with the locking jaw (e.g., the locking jaw 372 in FIGS. 16 and 17). In an embodiment, the first driving bar 352 and the second driving bar 354 may be coupled by the driving shaft 356, and the first driving bar 352 and the second driving bar 354 may be folded or unfolded around the driving shaft 356.

According to an embodiment, the guide rail 360 may include a guide groove 362 (e.g., the guide groove 362 in FIG. 5A) on which at least a portion (e.g., the protrusion 324 in FIG. 5B) of the flexible display 310 and/or the bendable member 320 is supported. The guide rail 360 may provide a path through which the flexible display 310 and/or the bendable member 320 moves through the guide groove 362. For example, it may be disposed inside the guide rail 360 in the y axis direction and the -y axis direction, respectively. The guide groove 362 may be formed to have a length in the x axis direction and the -x axis direction in the guide rail 360. The guide rail 360 may have a shape corresponding to the shape of a third side cover (e.g., the third side cover 223 in FIGS. 2A and 2B) and/or a fourth side cover 224. Accordingly, the bendable section (e.g., the bendable section ② in FIG. 2B) of the flexible display 310 may slide in the second housing 370 (e.g., move in the x axis direction) or slide out of the same (e.g., move in the -x axis direction) along the guideline 360 so that the flexible display 310 may slide in or slide out while being seamlessly connected to the side surface (e.g., the third edge portion 220b in FIGS. 2A and 2B) of the second housing 370.

According to an embodiment, when the bendable section (e.g., the bendable section ② in FIG. 2B) of the flexible display 310 moves, the second housing 370 may move together with the flexible display 310, thereby forming the exterior of the electronic device 300.

According to an embodiment, the first housing 380 may be coupled to the front case 330, provide a space for the electronic components (e.g., the printed circuit board, the battery, the sensor module, the sound module, or the camera module) disposed inside the electronic device 300, and form at least a portion of the exterior of the electronic device 300.

According to an embodiment, the back cover 390 (e.g., back glass) may be coupled to at least a portion of the first housing 380, and may be the external case of the electronic device 300. The back cover 390 may be formed of polymer, coated or tinted glass, ceramic, metal (e.g., aluminum, stainless steel (STS), or magnesium), or a combination of at least two thereof.

Figure 5A:
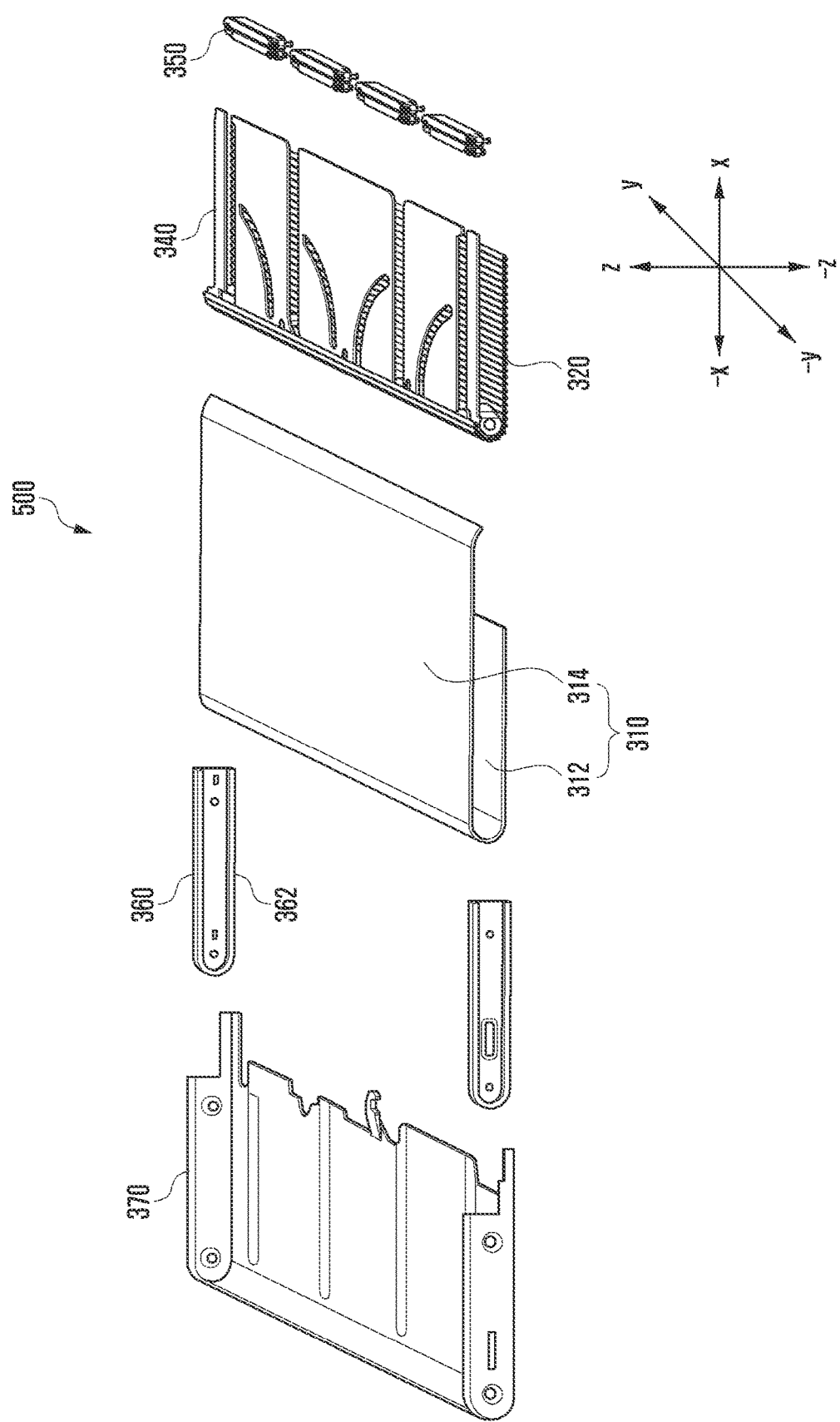
FIG. 5A is a view illustrating the configuration of a sliding module of an electronic device according to an embodiment of the disclosure.
Figure 5B:
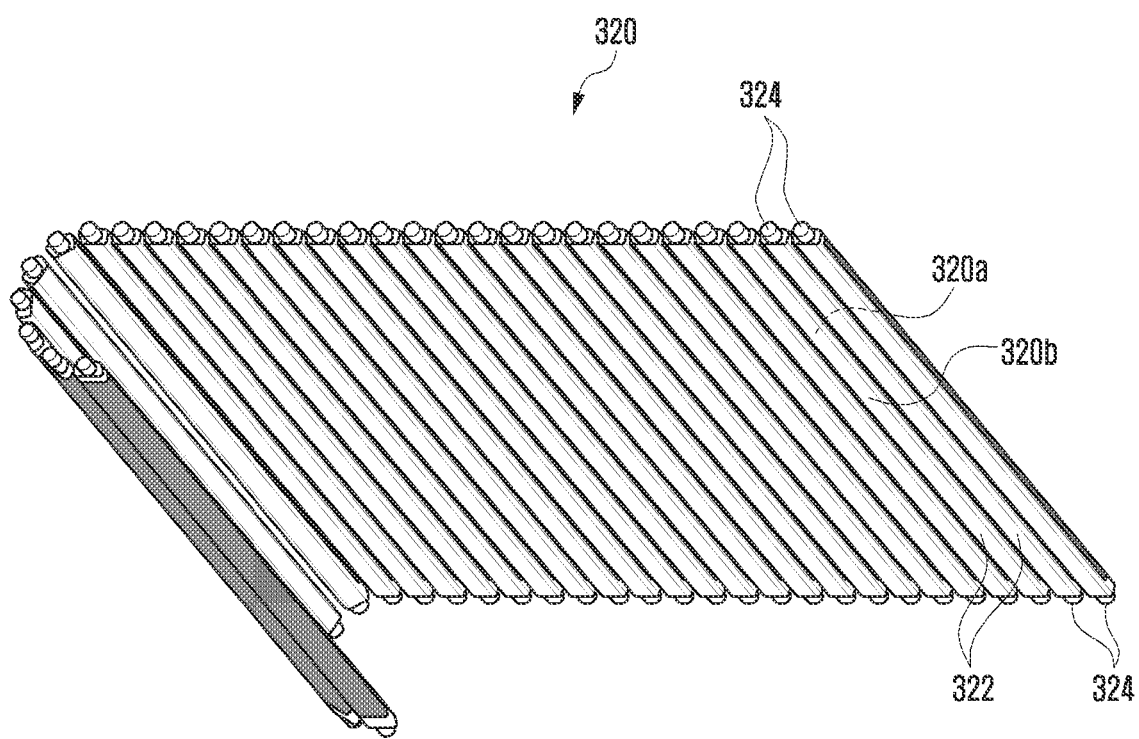
FIG. 5B is a view illustrating a bendable member of an electronic device according to an embodiment of the disclosure.

FIG. 4A is a view illustrating a front surface (e.g., a surface on which a screen is displayed) of an electronic device 300 in a first state (e.g., a closed state) according to an embodiment of the disclosure. FIG. 4B is a view illustrating a front surface (e.g., a surface on which a screen is displayed) of an electronic device 300 in a second state according to an embodiment of the disclosure. FIG. 4C is a view illustrating a rear surface of an electronic device 300 in a first state according to an embodiment of the disclosure. FIG. 4D is a cross-sectional view of an electronic device according to an embodiment of the disclosure. FIG. 5A is a view illustrating the configuration of a sliding module 500 of an electronic device 300 according to an embodiment of the disclosure. FIG. 5B is a view illustrating a bendable member of an electronic device according to an embodiment of the disclosure.

The electronic device 300 in FIGS. 4A to 4D may be at least partially similar to the electronic device 101 in FIG. 1 or the electronic device 200 in FIGS. 2A and 2B, or may further include other embodiments of the electronic device.

According to an embodiment, FIG. 4D is a cross-sectional perspective view of the electronic device 300 taken along the line A1-A2 in FIG. 4A.

Referring to FIGS. 4A to 4D, 5A, and 5B, a slide module 500 of the electronic device 300 according to an embodiment of the disclosure may include a bendable member 320 supporting at least a portion of a flexible display 310 (e.g., the flexible display 230 in FIG. 2A), a sliding frame 340 (e.g., the first housing), a driving body 350, a guide rail 360, and a second housing 370. A screen (e.g., the screen 2301 in FIGS. 2A and 2B) of the flexible display 310 may be expanded and contracted by the slide module 500.

The bendable member 320 may include a plurality of guide bars 322 rotatably connected to each other. According to an embodiment, the bendable member 320 may include an upper surface 320a formed through a plurality of guide bars 322 and a rear surface 320b (e.g., a rear surface) facing in the direction opposite the upper surface 320a (e.g., a front surface). According to an embodiment, the upper surface 320a may face the flexible display 310, and the rear surface 320b may face the inner space of the electronic device 200 (e.g., the second housing 220).

According to an embodiment, the plurality of guide bars 322 may be formed of a metal material and/or polymer. Each of the plurality of guide bars 322 may include the guide protrusions 324 that protruding from both ends thereof to be guided along the guide rail 360 in the inner space of the electronic device 300.

According to an embodiment, some or all of the plurality of guide bars 322 may include a friction reducing area (e.g., at least one of a polyoxymethylene (POM) layer, an acetal layer, or a Teflon layer) to reduce friction. For example, the friction reducing area may be included in the area in which contact (or friction) of at least one guide bar among the plurality of guide bars 322 occurs. For example, the friction reducing area may be included as a layer (e.g., a coating layer) in the area in contact with at least a portion of the slide plate 342, the sliding bar 344, the roller 400, and/or the driving body 350. Accordingly, frictional resistance with a corresponding structure (e.g., the slide plate 342, the sliding bar 344, the roller 400, and/or the driving body 350) according to the sliding operation of the bendable member 320 may be reduced.

The sliding frame 340 may be coupled to the second housing 370 that moves a specified reciprocating distance from the first housing 380 (or the front case 330). At least a portion of the flexible display 310 may be attached to the bendable member 320 and may be supported by at least a portion of the bendable member 320. The bendable member 370 may be supported by the front case 330 and/or the sliding frame 340.

As an example, when the electronic device 300 is in the open state (e.g., the first state), one area (e.g., the area corresponding to the first housing 380 or the fixed area 314) of the bendable member 320 may be supported by the front case 330. In addition, another area (e.g., the area corresponding to the second housing 370 or the extension area 312) may be supported by the sliding frame 340. Accordingly, the fixed area 314 of the flexible display 310 supported by the bendable member 320 may form a flat surface by the front surface (e.g., the surface facing the flexible display 310) of the front case 330. In addition, a portion of the extension area 312 of the flexible display 310 may form a flat surface by the flat area (e.g., the slide plate 342 in FIG. 3) of the sliding frame 340, and another portion may form a curved surface by the curved area (e.g., the sliding bar 344 in FIG. 3) of the sliding frame 340.

For example, in the closed state (e.g., the first state) of the electronic device 300, at least a portion of the bendable member 320 may be accommodated in the second housing 370. The bendable member 320 may slide in the space between the sliding frame 340 and the second housing 370 while being supported by the sliding bar (e.g., the sliding bar 344 in FIG. 3) of the electronic device 300. In this case, at least a partial area of the bendable member 320 may come into contact with the driving body 350.

For example, when switching from the open state to the closed state or switching from the closed state to the open state, the bendable member 320 may have friction with the slide plate 342, the sliding bar 344, and/or the driving body 350 due to contact with at least a portion thereof. The electronic device 300 according to an embodiment of the disclosure may reduce friction due to contact with at least a portion of the slide plate 342, the sliding bar 344, and/or the driving body 350.

In an embodiment, although not shown, the area of the bendable member 320 substantially corresponding to the fixed area 314 may be formed of a plate (e.g., a support plate). At least a portion (e.g., the bendable section ② in FIG. 2B) of the flexible display 310 may be accommodated in the inner space of the second housing 370 while being supported by the bendable member 320 (or by the bendable member 320) in the closed state to then be disposed to be invisible to the outside.

According to an embodiment, at least a portion (e.g., the bendable section ②) of the flexible display 310 may be disposed to be visible to the outside while being supported by the bendable member 320 in the open state.

According to an embodiment, the electronic device 300 may include a front surface 300a on which a screen of the display 310 is displayed, a rear surface 300b facing in the direction opposite the front surface 300a, and a side surface 300c surrounding the space between the front surface 300a and the rear surface 300b.

According to an embodiment, the areas of the front surface 300a and the rear surface 300b of the electronic device 300 may vary depending on the state of the electronic device 300 (e.g., the open state or the closed state). For example, when the electronic device 300 is in the open state (e.g., the open state in FIG. 2B), the bendable section ② of the flexible display 310 may slide out so that the area of the front surface 300a of the electronic device 300 may increase. For example, when the electronic device 300 is in the closed state (e.g., the closed state in FIG. 2A), the area of the rear surface of the electronic device 300 may include the area of the rear cover 390. In addition, when the electronic device 300 is in the open state, the area of the rear surface of the electronic device 300 may include the area substantially corresponding to the bendable area ② among the area of the rear cover 390 and the rear surface of the second housing 370.

According to an embodiment, the flexible display 310 may include a fixed area 314 (e.g., the fixed section ① in FIG. 2B) always visible to the outside and an extension area 312 (e.g., the bendable section ② in FIG. 2B) that extends from the fixed area 314 and slides in the second housing 370 or slides out of the same according to movement of second housing 370.

According to an embodiment, the extension area 312 (e.g., the second area) (e.g., the bendable section ② in FIG. 2B) of the flexible display 310 may be extended along the first direction (e.g., the −x axis direction) while being supported by the bendable member 320 in the open state. In this case, at least a portion of the fixed area 314 (e.g., the first area) (e.g., the fixed section ① in FIG. 2B) and the extension area 312 (e.g., the second area) (e.g., the bendable section ② in FIG. 2B) may form substantially the same plane.

In the electronic device 300, as the second housing 370 and the sliding frame 340 slide in a first direction (e.g., the −x axis direction) or in a second direction (e.g., the x axis direction) opposite the first direction (e.g., the −x axis direction), the size (or area) of the display area (e.g., the screen 2301 in FIGS. 2A and 2B) of the flexible display 310 may vary.

According to an embodiment, an operation of expanding the screen (e.g., sliding-out) and/or contracting the screen (e.g., sliding-in) of the electronic device 300 may be manually performed through a user's manipulation.

According to an embodiment, an operation of expanding the screen (e.g., sliding-out) and/or contracting the screen (e.g., sliding-in) of the electronic device 300 may be performed automatically or semi-automatically using a driving device (e.g., a motor, a ball screw, a cam, a slider crank, or a hinge).

Figure 8:
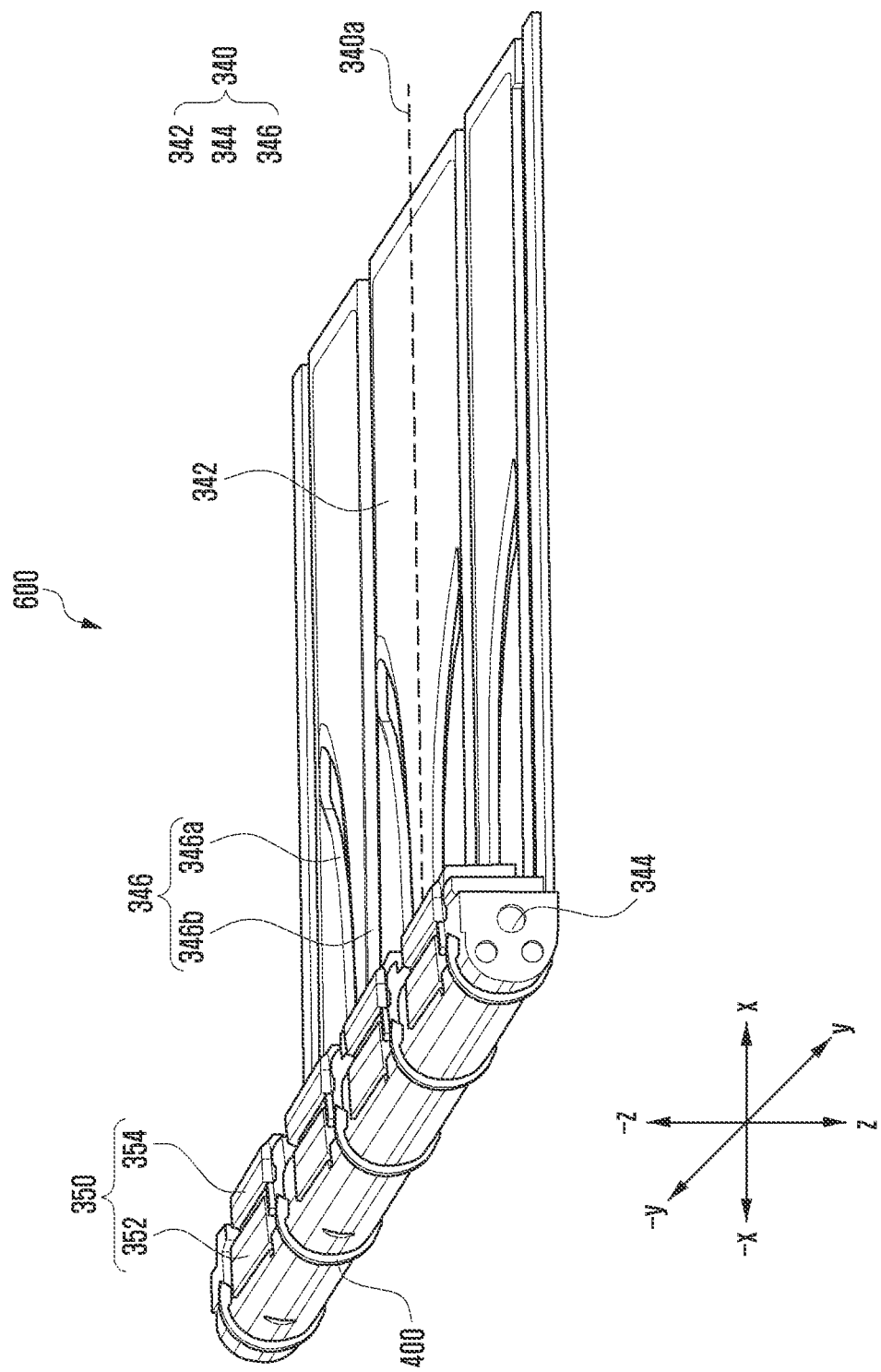

FIG. 6 is a view illustrating a sliding frame module 600 of an electronic device according to an embodiment of the disclosure. FIGS. 7 and 8 are views showing that a driving body 350 is coupled to a sliding frame 340 and that a roller 400 is coupled to a sliding bar 344 according to various embodiments of the disclosure.

Referring to FIGS. 6 to 8, a sliding frame module 600 may include a sliding frame 340, a driving body 350, and a roller 400.

A first driving bar 352 (e.g., the first driving bar 352 in FIG. 11) may be self-rotatably coupled to the sliding frame 340 (e.g., the second housing), and a second driving bar 354 (e.g., the second driving bar 354 in FIG. 11) may be self-rotatably coupled to the front case 330 (e.g., the first housing) so that the driving body 350 may be folded or unfolded. The first driving bar 352 and the second driving bar 354 may be pivotally connected by a driving shaft 356. For example, the driving body 350 may be folded about the driving shaft 356 such that the first driving bar 352 and the driving bar 354 come into contact with each other or are unfolded to open at a specified angle.

The first driving bar 352 and the second driving bar 354 may have the same shape or different shapes from each other, and it should be noted that the driving bar coupled to the sliding frame 340 will be referred to as a first driving bar 352 and that the driving bar coupled to the front case 330 will be referred to as a second driving bar 354 below, regardless of the disposed direction and shape of the driving body 350.

A plurality of guide slits 346 may include a plurality of first guide slits 346a having a predetermined curvature and a plurality of second guide slits 346b having a linear shape. The plurality of first guide slits 346a and the plurality of second guide slits 346b may be alternately disposed. In some embodiments, the plurality of first guide slits 346a and the plurality of second guide slits 346b may be irregularly disposed. The plurality of first guide slits 346a may have the same shape or different shapes from each other. For example, the plurality of first guide slits 346a may be formed to have the same shape, for example, to have a curve having the same direction and circumferential angle, but in this case, pressure may be applied to the sliding frame 340 in one direction, thereby causing distortion or deformation of the sliding frame 340. In order to prevent distortion and deformation of the sliding frame 340, the plurality of first guide slits 346a may be formed to be symmetrical with each other, based on the center line 340a (e.g., the center line 340a in FIG. 11) of the sliding frame 340. For example, at least one first guide slit 346a formed on a first side (e.g., the y axis direction) of the center line 340a and at least one first guide slit 346a formed on a second side thereof (e.g., the −y axis direction) may be disposed. At least one first guide slit 346a formed on the first side (e.g., the y axis direction) and at least one first guide slit 346a formed on the second side (e.g., the −y axis direction) may be formed to have a shape symmetrical with each other based on the center line 340a. For example, at least one first guide slit 346a formed on the first side of the center line 340a may be formed to have a predetermined curvature in a first direction, and at least one first guide slit 346a formed on the second side thereof may be formed to have a predetermined curvature in a second direction opposite the first direction.

The plurality of first guide slits 346a may include the same number of at least one first guide slit 356a on both sides of the center line 340a.

The plurality of second guide slits 346b may have a linear shape. Each of the second guide slits 356b may form an opening directed to the front case 330 on the slide plate 342. A first link portion 352a and a second link portion 354a of the driving body 350 may be disposed in the second guide slit 356b to move linearly, and the second link portion 354a may be coupled to the front case 330 through the opening. The plurality of second guide slits 356b may include the same number of at least one second guide slit 356b on both sides of the center line 340a.

The plurality of driving bodies 350 may be disposed in the same direction, but in this case, distortion and/or deformation of the sliding frame 340 may occur as described above. To prevent this, the plurality of driving bodies 350 may be disposed to be symmetrical with each other based on the center line 340a of the sliding frame 340 (e.g., the center line 340a in FIG. 11). For example, the driving bodies 350 on the first side of the center line 340a and the driving bodies 350 on the second side thereof may be disposed to be folded or unfolded in a symmetrical form.

A plurality of roller holes 348 may be formed at regular intervals in the sliding bar 344. The roller hole 348 may have a predetermined width in order for the roller 400 to be inserted thereinto. Rollers 400 corresponding to the number of roller holes 348 may be coupled to the sliding bar 344. For example, a corresponding number of rollers 400 may be disposed on both sides of the center line 340a. For example, in the case of including an odd number of rollers 400, one roller 400 corresponding to the position of the center line 340a may be located at the center of the sliding bar 344, and an equal number of remaining rollers 400 may be located on both sides of the center line 340a.

In an embodiment, the roller 400 may have a shape corresponding to the shape of the roller hole 348. For example, the width of the roller 400 may correspond to the width of the roller hole 348, or may be smaller than the width of the roller hole 348 by a predetermined value (e.g., 0.5 mm). For example, the roller 400 may have a diameter corresponding to the sliding bar 344. For example, when the roller 400 is coupled to the sliding bar 344 through the roller hole 348, the roller 400 may not substantially protrude or be recessed. For example, when the roller 400 is coupled to the sliding bar 344 through the roller hole 348, at least a portion (e.g., 0.1 to 0.2 mm) of the roller 400 may protrude. Accordingly, when the bendable member 320 moves on the sliding bar 344, the bendable member may come into contact with the sliding bar 344 and the roller 400, thereby producing frictional resistance. This frictional resistance may be reduced by the rotational force of the roller. In some embodiments, in the case where a relatively large number of rollers 400 are rotatably disposed in the sliding bar 344 and protrude above the outer surface of the sliding bar 344, the bendable member 320 may come into contact with only a plurality of rollers 400, which may further reduce the frictional resistance. In some embodiments, the roller 400 may have only a single roller that has a length similar to that of the sliding bar 344 and is rotatably fixed to the sliding bar.

Figure 9:
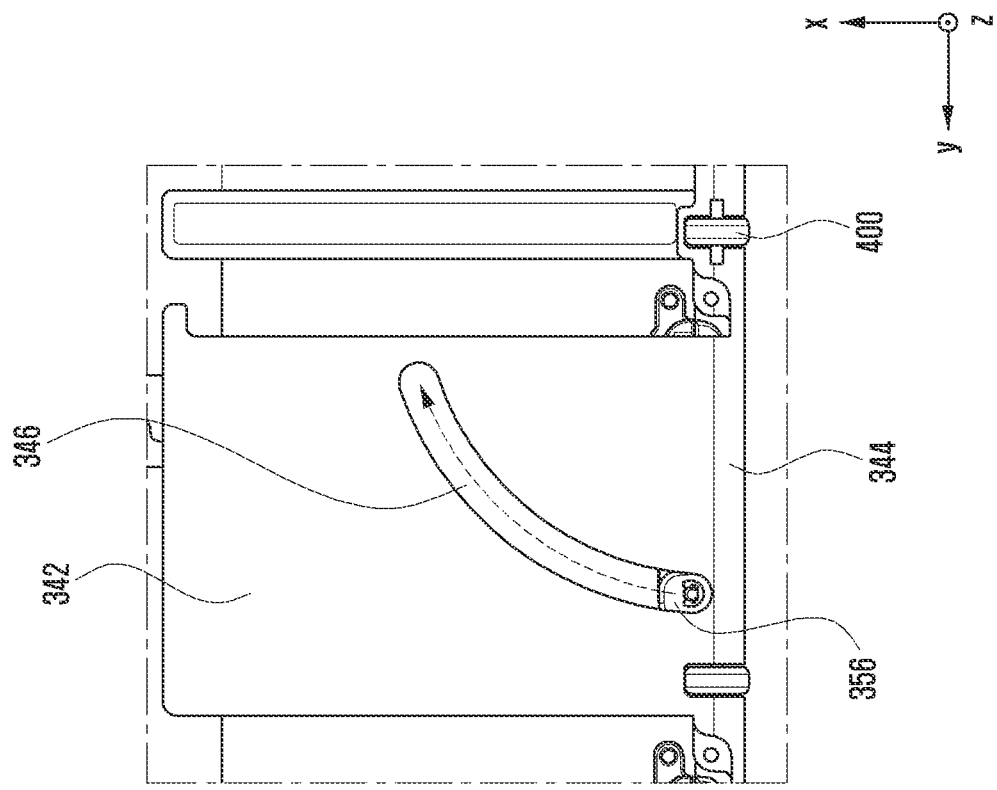
FIG. 9 is a view illustrating a first guide slit formed in a sliding frame and a driving body coupled to the first guide slit according to an embodiment of the disclosure.
Figure 9:
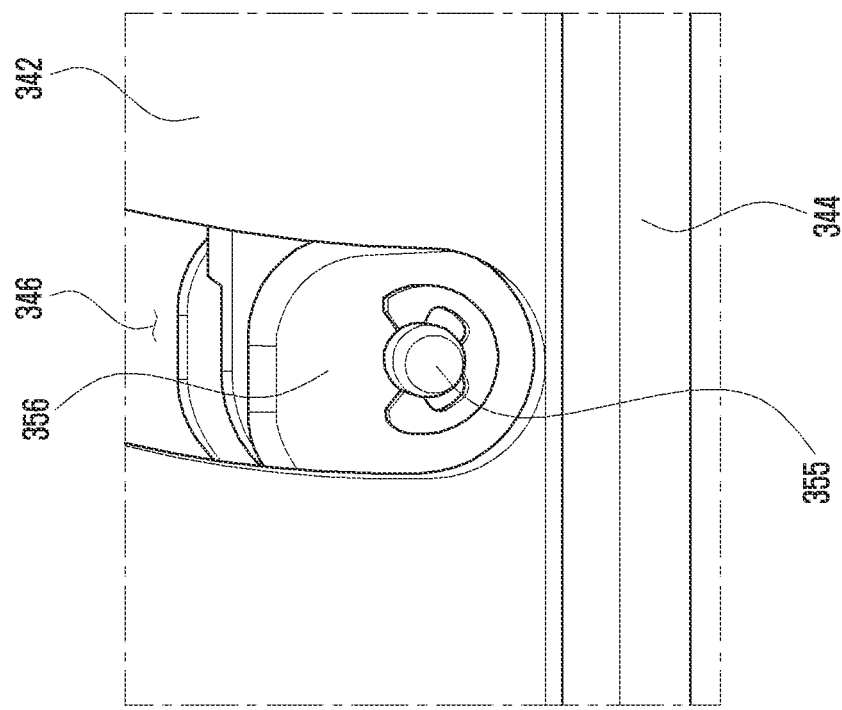
Figure 10A:
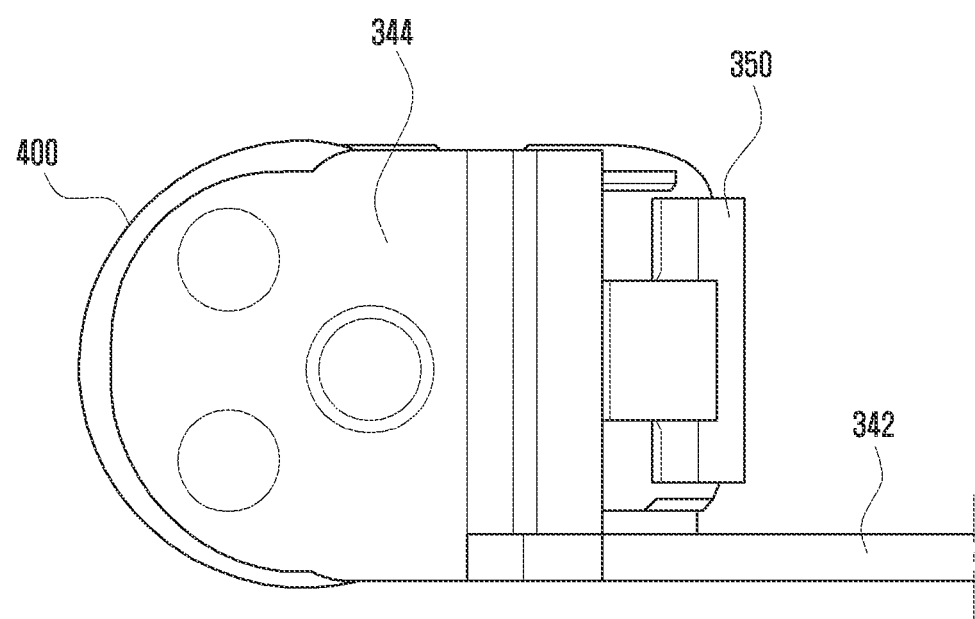
FIGS. 10A and 10B are views showing that a roller is coupled to a sliding bar according to various embodiments of the disclosure.
Figure 10B:
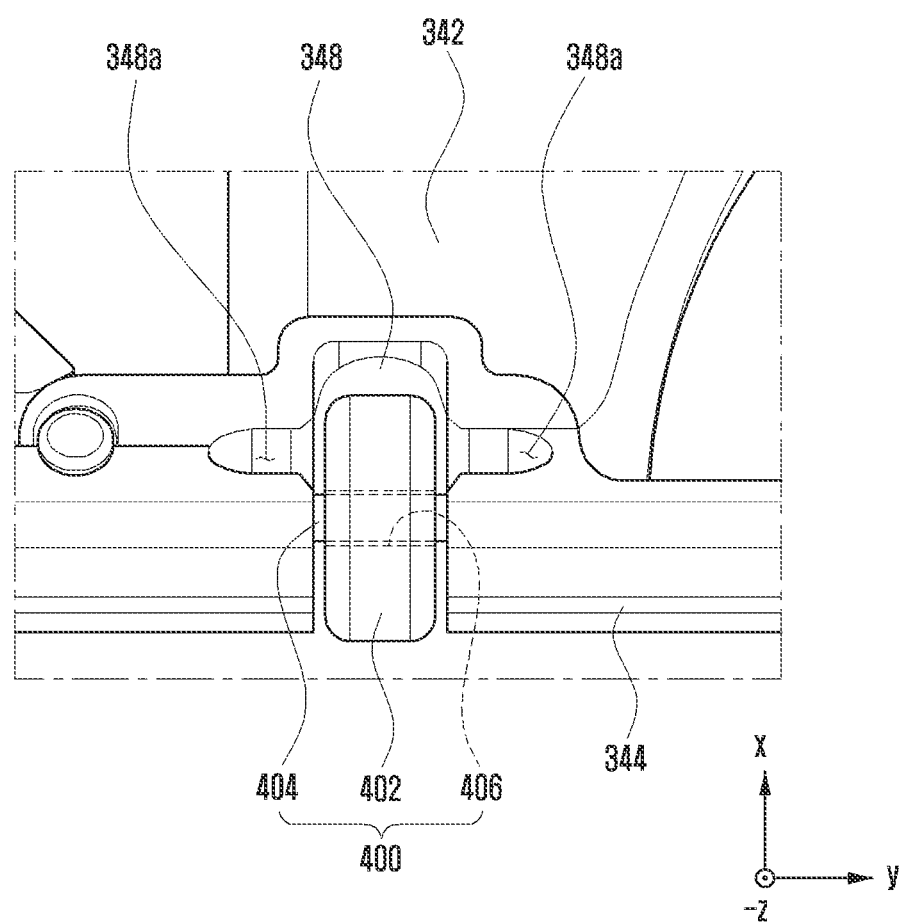

FIG. 9 is a view illustrating a first guide slit 346a formed in a sliding frame and a driving body 350 coupled to the first guide slit 346a according to an embodiment of the disclosure. FIGS. 10A and 10B are views showing that a roller 400 is coupled to a sliding bar 344 according to various embodiments of the disclosure.

Referring to FIGS. 9, 10A, and 10B, driving shafts 356 of a plurality of driving bodies 350 may be inserted and coupled to a plurality of first guide slits 346a of the sliding frame 340. The driving body 350 may include a link 355 for convenience of assembly when a driving shaft 356 is inserted into the first guide slit 346a. When the driving shaft 356 is coupled to the first guide slit 346a, at least a portion of the driving shaft 356 may move along the first guide slit 346a. For example, when a first driving bar (e.g., the first driving bar 352 in FIGS. 11 and 12A) and a second driving bar (e.g., the second driving bar 354 in FIGS. 11 and 12A) of the driving body 350 are folded to come into contact with each other or unfolded to be spaced apart from each other, a first link portion 352a and a second link portion 354b may reciprocate in the second guide slit 346b to move away from or close to each other. Accordingly, the driving shaft 356 may move in a curve along the first guide slit 346a according to the positions of the first link portion 352a and the second link portion 354a.

A plurality of roller holes 348 may be formed at regular intervals in the sliding bar 344. The roller hole 348 may be formed to have a predetermined width in order for the roller 400 to be inserted thereinto.

In an embodiment, the roller 400 may include a roller body 402 and a roller shaft 404. A through-hole 406 passing through the roller body may be formed in the center of the roller body 402, and the roller shaft 404 may be fitted into the through-hole 406 so that the roller body 402 may rotate. Alternatively, it will be readily understood by those skilled in the art that the roller 400 may be formed by injecting the roller body 402 and the roller shaft 404 into a single component. The roller 400 may be fitted into each roller hole 348, and the roller shaft 404 may be fitted into a roller shaft hole 348a formed in the sliding bar 344 so that the roller 400 may be rotatably mounted or coupled to the sliding bar 344. It is possible to reduce friction produced in the bendable member 320 by the rotation of the roller 400 mounted or coupled to the sliding bar 344. For example, the roller body 402 may protrude above the sliding bar 344 such that the bendable member 320 and the roller body 402 come into contact with each other, so that the bendable member 320 may move by the rotation of the roller 400, thereby reducing frictional resistance produced in the bendable member 320. As another example, in the case where friction occurs between the bendable member 320 and the sliding bar 344 because the outer surface of the sliding bar 344 is formed lower than the roller body 402, rotational movement of the roller 400 may reduce the friction between the bendable member 320 and the sliding bar 344.

Figure 11:
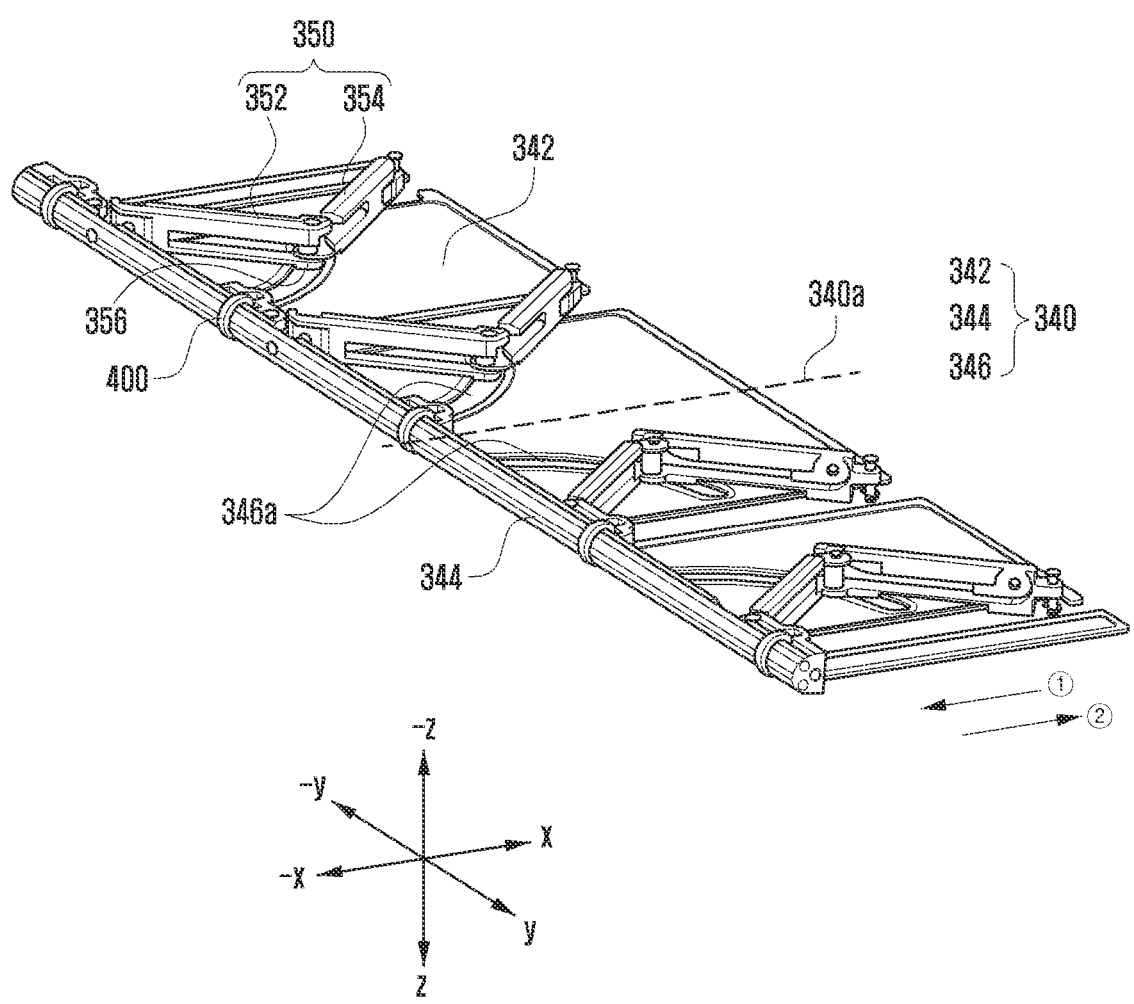
FIG. 11 is a view showing that a driving body coupled to a sliding frame is unfolded to move the sliding frame according to an embodiment of the disclosure.

FIG. 11 is a view showing that a driving body 350 coupled to a sliding frame 340 is unfolded to move the sliding frame 340 according to an embodiment of the disclosure.

Referring to FIG. 11, a plurality of driving bodies 350 operates to be unfolded (e.g., sliding-out) (e.g., open state driving), thereby pushing the sliding bar 344 in a first direction (e.g., the −x axis direction) to guide the sliding frame 340 in the slide-out direction (e.g., the −x axis direction). Accordingly, the second housing 370 to which the sliding frame 340 is coupled may move in the first direction (e.g., the −x axis direction) together with the sliding frame 340, and an extension area (e.g., the extension area 312 in FIG. 5A) of the flexible display 310 may slide out of the second housing 370 to be visible to the outside.

As an embodiment, the driving body 350 operates to be folded (e.g., sliding-in) (e.g., closed state driving), thereby moving the sliding bar 344 in a second direction (e.g., the x axis direction) opposite the first direction (e.g., −x axis direction) to guide the sliding frame 340 in the slide-in direction. Accordingly, the second housing 370 coupled to the sliding frame 340 may move together with the sliding frame 340, and the extension area (e.g., the extension area 312 in FIG. 5A) of the flexible display 310 may slide in the second housing 370 to be invisible to the outside. For example, the electronic device 300 may switch from the closed state to the open state or from the open state to the closed state by automatically or semi-automatically pushing or pulling the sliding bar 344 using a driving force of the motor.

The plurality of driving bodies 350 may prevent the flexible display 310 from sagging by supporting the bendable member 320 during operation.

The sliding bar 344 of the sliding frame 340 may come into contact with a bent portion of the bendable member 320 in a curved portion (e.g., the curved portion 300d in FIG. 4D). For example, when the bendable member 320 moves, friction may occur between the guide bars 322 in contact with the curved portion of the sliding bar 344, among the plurality of guide bars 322 included in the bendable member 320, and the bendable member 320. The sliding bar 344 may be formed of a metal material and/or polymer. According to an embodiment, in order to reduce friction against the bendable member 320, the sliding bar 344 may be formed of a material that reduces friction, or may further include a layer (e.g., a Teflon-coated layer or a hard coated layer) for reducing friction. In some embodiments, the layer for reducing friction may be disposed on the surface in contact with the sliding bar 344 of the bendable member 320.

FIG. 12A is a diagram illustrating a driving body 350 of an electronic device according to an embodiment of the disclosure. FIGS. 12B to 12F are views illustrating a coupling structure between a sliding frame 340 and a driving body 350 and a coupling structure between a driving body 350 and a front case 330 according to various embodiments of the disclosure.

Referring to FIGS. 12A to 12F, the driving body 350 may include a first driving bar 352 rotatably coupled to the sliding frame 340, a second driving bar 354 rotatably coupled to the front case 330, and an elastic member 358 for pressing the first driving bar 352 and the second driving bar 354 in the direction in which they are unfolded. The first driving bar 352 and the second driving bar 354 may be rotatably coupled through a driving shaft 356.

According to an embodiment, the driving body 350 and the sliding bar 344 may be rotatably coupled through a first coupling pin 357. The driving body 350 and the front case 330 may be rotatably coupled through a second coupling pin 359. For example, the first driving bar 352 and the driving shaft 356 may be integrally formed. For example, the second driving bar 354 and the driving shaft 356 may be integrally formed. For example, the driving shaft 356 may be formed as a separate configuration from the first driving bar 352 and the second driving bar 354.

According to an embodiment, when the electronic device 300 is in the open state, the first driving bar 352 and the second driving bar 354 may be unfolded at a predetermined angle (e.g., the angle θ in FIG. 12A). In the open state, the sliding bar 344 may extend from the front case 330 in the first direction (e.g., the −X axis direction).

According to an embodiment, when the electronic device 300 is in the closed state, the first driving bar 352 and the second driving bar 354 may be disposed to be adjacent to or come into at least partial contact with the sliding bar 344 of the sliding frame 340. For example, when the electronic device 300 switches from the open state to the closed state, the sliding bar 344 may move in the second direction (e.g., the X axis direction) to be disposed adjacent to the front case 330. For example, the driving body 350 may be formed to have a predetermined length, and a first link portion 352a for a connection with the sliding bar 344 may be formed at the end of the first driving bar 352, and a second link portion 354a for a connection with the front case 330 may be formed at the end of the second driving bar 354. For example, a first coupling pin 357 may be inserted into the first link portion 352a of the first driving bar 352 and the sliding bar 344 so that the first driving bar 352 may be rotatably coupled to the sliding bar 344. For example, a second coupling pin 359 may be inserted into the second link portion 354a of the second driving bar 354 and the front case 330 so that the second driving bar 354 may be rotatably coupled to the front case 330.

According to an embodiment, the predetermined angle θ may be determined within a range of less than 180 degrees in order to induce an effective folding operation of the first driving bar 352 and the second driving bar 354.

According to an embodiment, the first driving bar 352 and the second driving bar 354 may be formed of a metal material and/or polymer.

According to an embodiment, the first driving bar 352 and/or the second driving bar 354 may include a friction reducing member or a friction reducing layer disposed on the portion in contact with the bendable member 320.

According to an embodiment, the elastic member 358 may be a torsion spring, and may be received inside a first spring receiving groove 352b formed in the first driving bar 352 and a second spring receiving groove 354b formed in the second driving bar 354. The elastic member 358 may be disposed so as not to protrude to the outside, and may provide an elastic force such that the first driving bar 352 and the second driving bar 354 may be unfolded.

Figure 13:
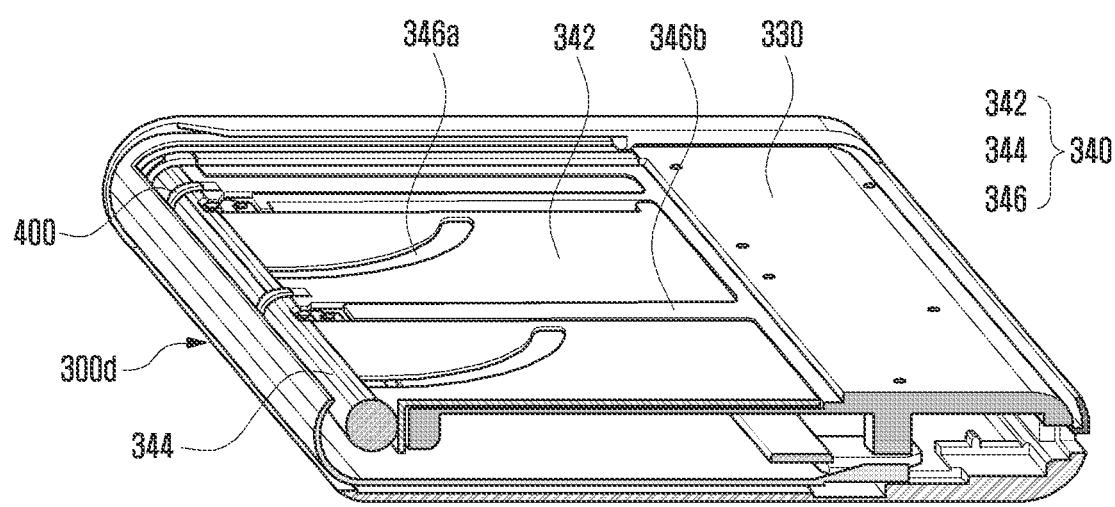
FIG. 13 is a view illustrating the state in which a roller is disposed in an electronic device according to an embodiment of the disclosure.
Figure 13:
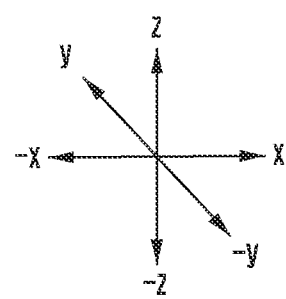
Figure 14:
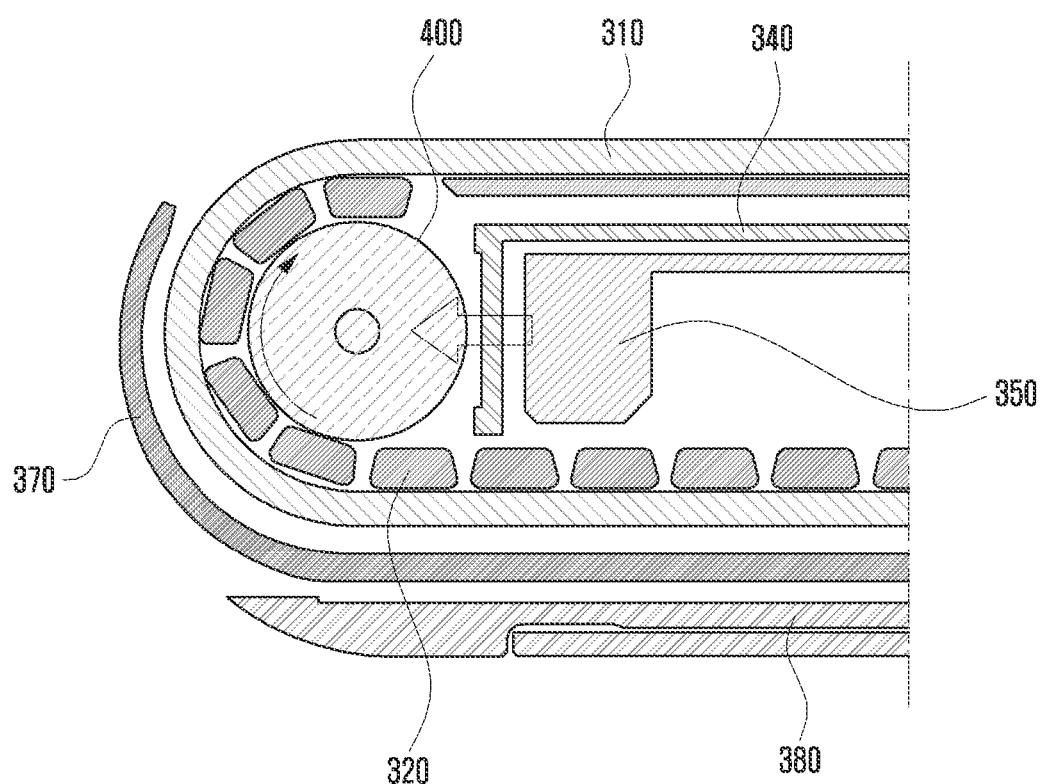
FIG. 14 shows that friction is reduced by a roller when the electronic device is in a closed state (e.g., a first state) (e.g., a screen contraction state) (e.g., rolling-in or sliding-in) and an open state (e.g., a second state) (e.g., a screen expansion state) (e.g., rolling-out or sliding-out) according to an embodiment of the disclosure.

FIG. 13 is a view illustrating the state in which a roller 400 is disposed in an electronic device 300 according to an embodiment of the disclosure. FIG. 14 shows that friction is reduced by a roller 400 when the electronic device 300 is in a closed state (e.g., a first state) (e.g., a screen contraction state) (e.g., rolling-in or sliding-in) and an open state (e.g., a second state) (e.g., a screen expansion state) (e.g., rolling-out or sliding-out) according to an embodiment of the disclosure.

Referring to FIGS. 13 and 14, when the flexible display 310 of the electronic device 300 moves, friction may occur in the bendable member 320 supporting the flexible display 310. For example, when expanding or contracting a screen (e.g., the screen 2301 in FIGS. 2A and 2B) of the flexible display 310, friction may occur between the bendable member 320 and the slide plate 342, between the bendable member 320 and the sliding bar 344, and/or between the bendable member 320 and the driving body 350. Accordingly, in order to reduce the friction, at least a portion of the bendable member 320, the slide plate 342, the sliding bar 344, and/or the driving body 350 may use a friction reducing material or include a friction reducing layer. Alternatively, a component for reducing friction (e.g., the roller 400) or a friction reducing member may be further disposed.

Figure 15:
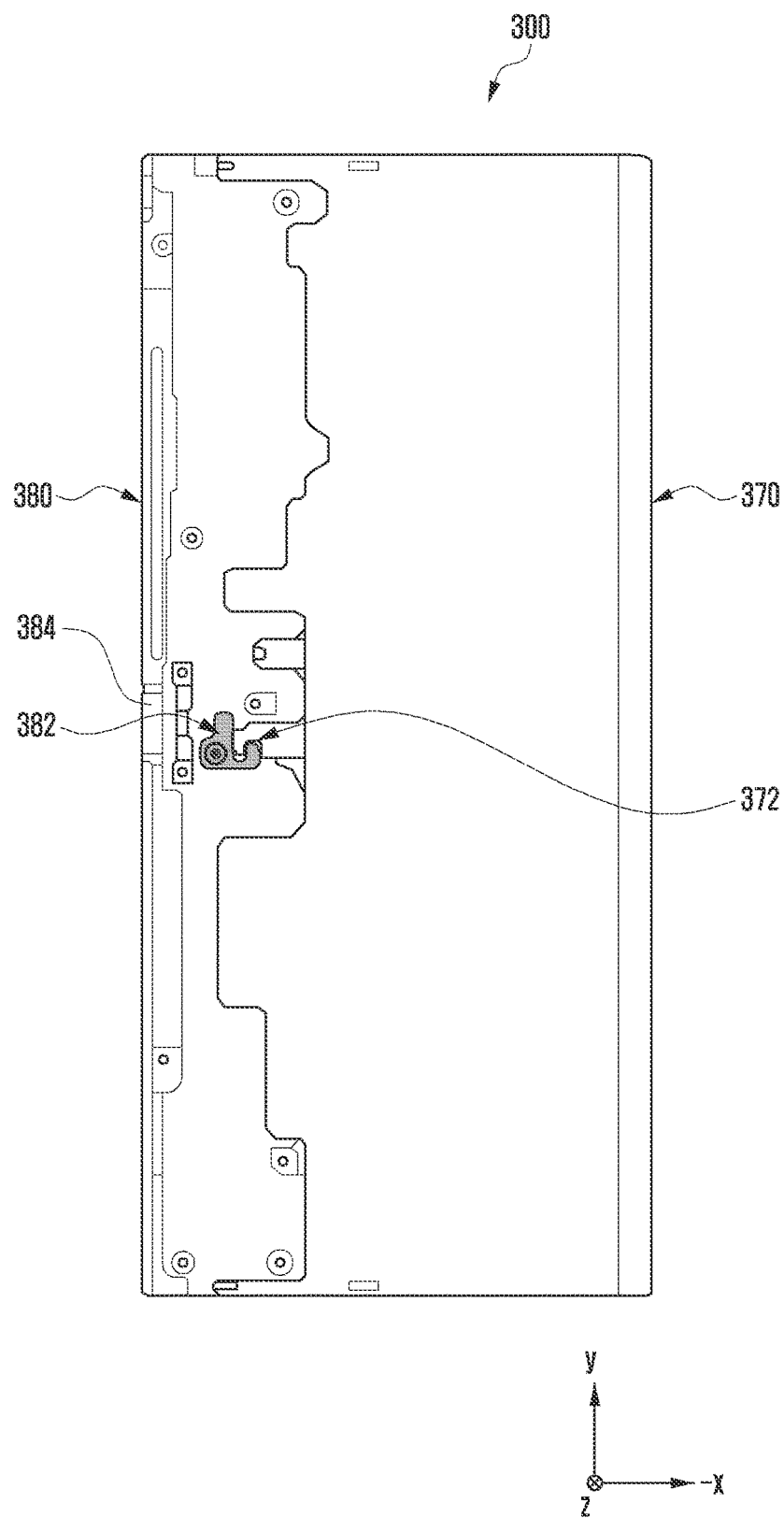
FIGS. 15 and 16 are views showing that a closed state (e.g., a first state) is maintained by a locking device according to various embodiments of the disclosure.
Figure 16:
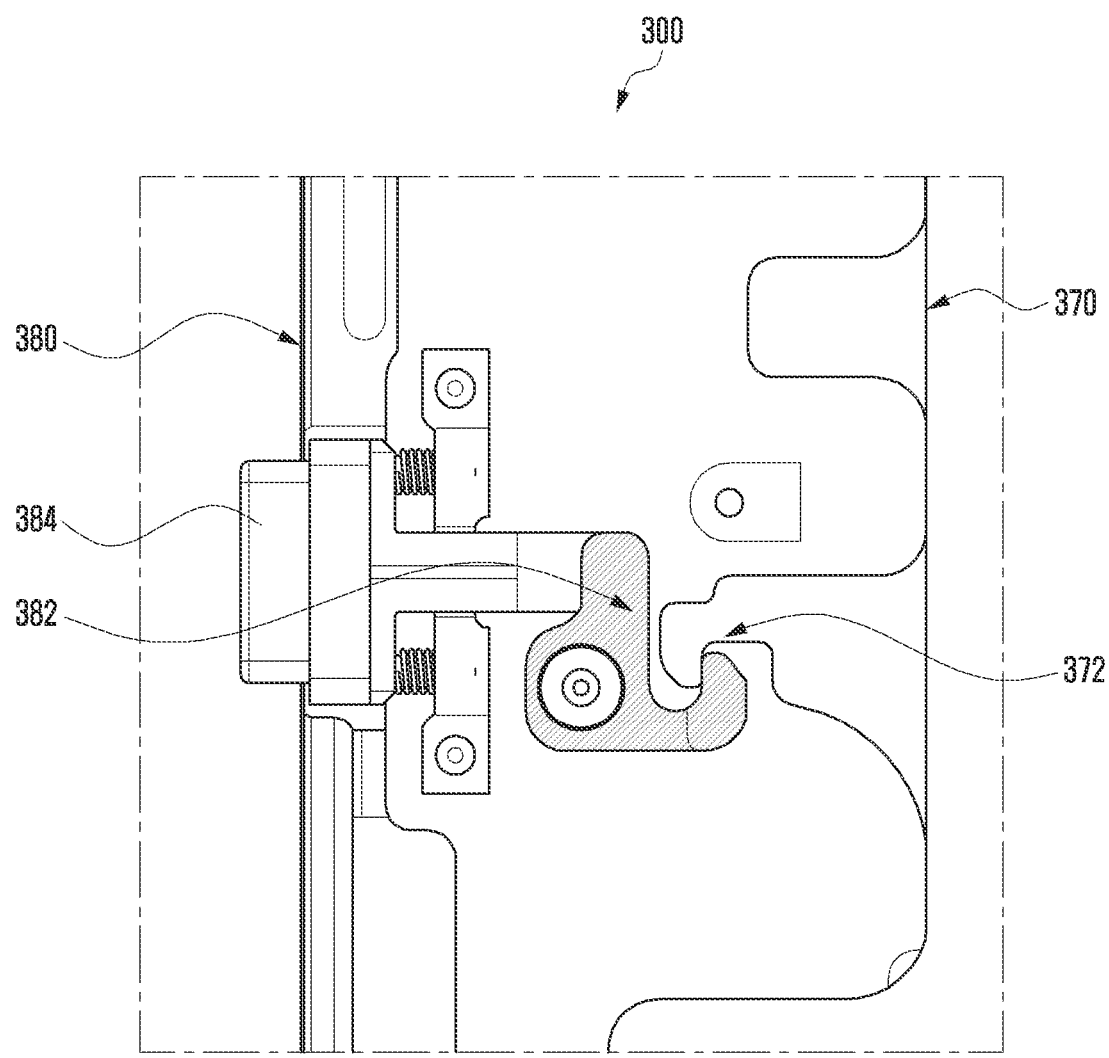
Figure 17:
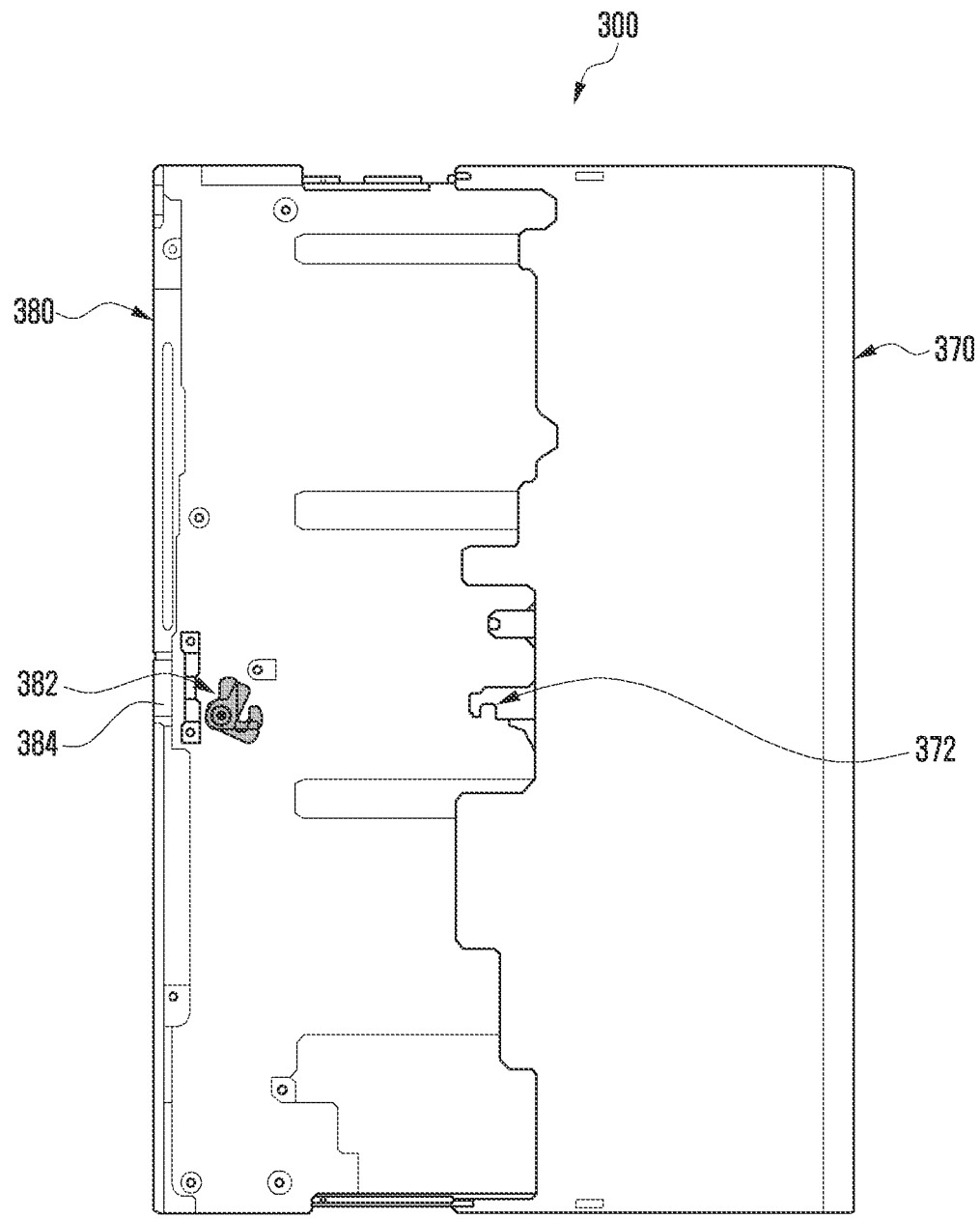
FIG. 17 is a view showing switching to an open state (e.g., a second state) by releasing the locking device according to an embodiment of the disclosure.

FIGS. 15 and 16 are views showing that a closed state (e.g., a first state) is maintained by a locking device according to various embodiments of the disclosure. FIG. 17 is a view showing switching to an open state (e.g., a second state) by releasing a locking device according to an embodiment of the disclosure.

Referring to FIGS. 15 to 17, according to an embodiment, the electronic device 300 may include a locking device 382 and a locking jaw 372 that prevents the driving body (e.g., the driving body 350 in FIG. 3) from being unfolded by an elastic body (e.g., the elastic member 358 in FIG. 12A) and maintains the electronic device 300 in the closed state.

The locking device 382 may be disposed on the rear surface (e.g., the surface opposite the surface on which the flexible display 310 is disposed) of the first housing 380 in order to provide a fastening force (or fixing force) against the elastic force of the elastic member 358. The locking jaw 372 may be formed on the rear surface of the second housing 370 so as to be caught on the locking device 382. When the locking device 382 is caught on the locking jaw 372, switching of the state by the elastic force of the elastic member (e.g., the elastic member 358 in FIGS. 12A and 12B) may be suppressed.

In the closed state of the electronic device 300, the locking device 382 may be caught on the locking jaw 372 to provide a fastening force (or fixing force) against the elastic force of the elastic member (e.g., the elastic member 358 in FIGS. 12A and 12B), thereby maintaining the electronic device 300 in the closed state. At this time, the first driving bar 352 and the second driving bar 354 of the driving body (e.g., the driving body 350 in FIGS. 12A and 12B) may remain in the folded state.

In the open state of the electronic device 300, when the locking device 382 is released (separated) from the locking jaw 372, the first driving bar 352 and the second driving bar 354 of the driving body 350 may be unfolded at a predetermined angle by the elastic force of the elastic member (e.g., the elastic member 358 in FIGS. 12A and 12B). The electronic device 300 may consistently remain in the open state (e.g., the second state) by the elastic force of the elastic member (e.g., the elastic member 358 in FIGS. 12A and 12B).

In an embodiment, the electronic device 300 may include an open button 384 connected to the locking device 382. When the user presses the open button 384 in the closed state of the electronic device 300, the locking device 382 may be released from the locking jaw 372 so that the electronic device 300 may switch to the open state by the elastic force provided by the elastic member 358.

In an embodiment, although not shown, the electronic device 300 may switch to the open state automatically or semi-automatically through a driving mechanism (e.g., a driving motor, a reducer module, and/or a gear assembly) disposed inside the electronic device 300. Alternatively, the electronic device 300 may switch the state manually by a force to push or pull the housing, which is provided by the user, and the method of opening/closing the electronic device 300 is not limited.

In an embodiment, the electronic device 300 may detect, through a processor (e.g., the processor 120 in FIG. 1), an event informing of switching to the closed state (e.g., the first state) or the open state (e.g., the second state) of the electronic device 300. For example, the processor 120 may detect the open state (e.g., the second state) or the closed state (e.g., the first state) of the electronic device 300 through at least one sensor (e.g., a hall sensor) included in the first housing 380 or the second housing 370 of the electronic device 300. For example, when an event notifying of switching to the open state (e.g., the second state) or the closed state (e.g., the first state) occurs, the electronic device 300 may adjust the image to be displayed on the flexible display 310 to fit the screen size.

Figure 18:
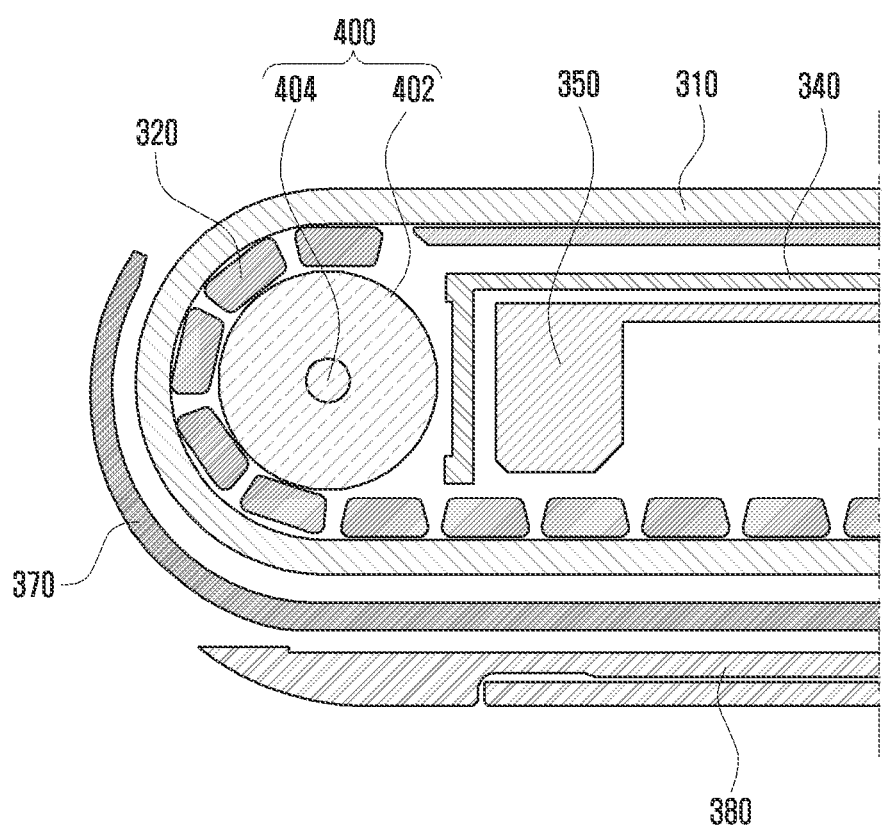
FIG. 18 is a view illustrating a roller and a bendable member according to an embodiment of the disclosure.

FIG. 18 is a view illustrating a roller 400 and a bendable member 320 according to an embodiment of the disclosure.

Referring to FIG. 18, the roller 400 of the electronic device 300 may include a roller body (e.g., the body 402 in FIG. 10B) and a roller shaft (e.g., the roller shaft 404 in FIG. 10B). The roller body (e.g., the body 420 in FIG. 10B) of the roller 400 may be formed of a material that produces low resistance or frictional force when rubbing against other objects. For example, it will be readily understood by those skilled in the art that the material may be formed of, but not limited to, one of rubber, a urethane material, or Teflon. For example, a material providing a smooth surface or having elasticity may be included. For example, the roller body (e.g., the body 420 in FIG. 10B) of the roller 400 may be formed of general PC injection or a metal material.

Figure 19:
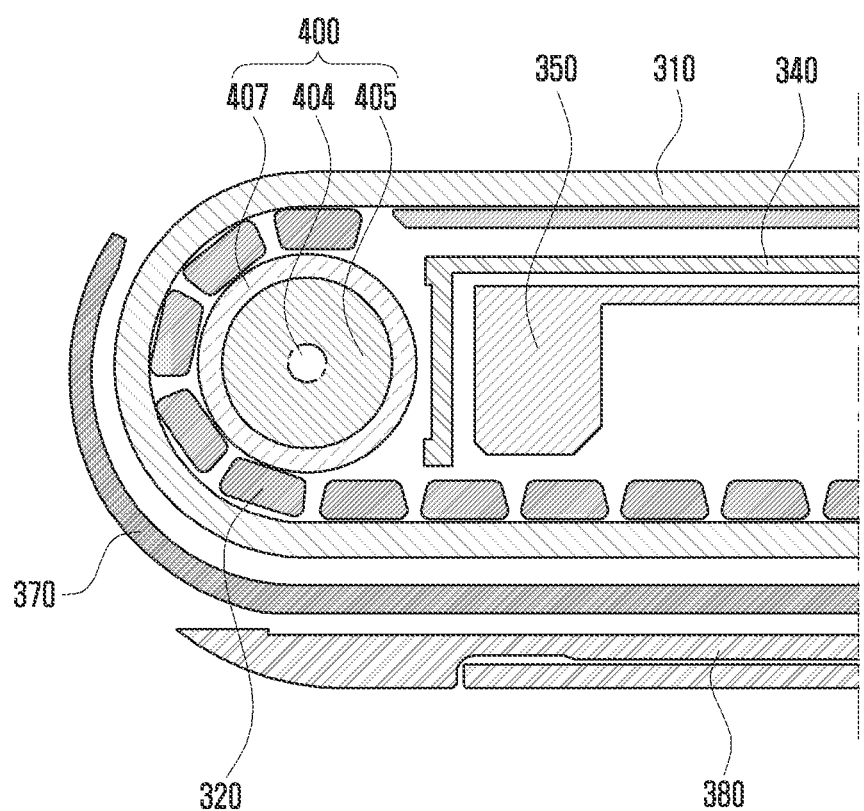
FIG. 19 is a view illustrating a roller and a bendable member according to an embodiment of the disclosure.

FIG. 19 is a view illustrating a roller 400 and a bendable member 320 according to an embodiment of the disclosure.

Referring to FIG. 19, the roller 400 may include a roller body 405 of a metal material, a friction reducing member 407 disposed to surround the outer surface of the roller body 405, and a roller shaft 404. The roller body 405 may be formed of a metal material. The friction reducing member 407 may be formed of a low friction rubber or Teflon tape.

Figure 20:
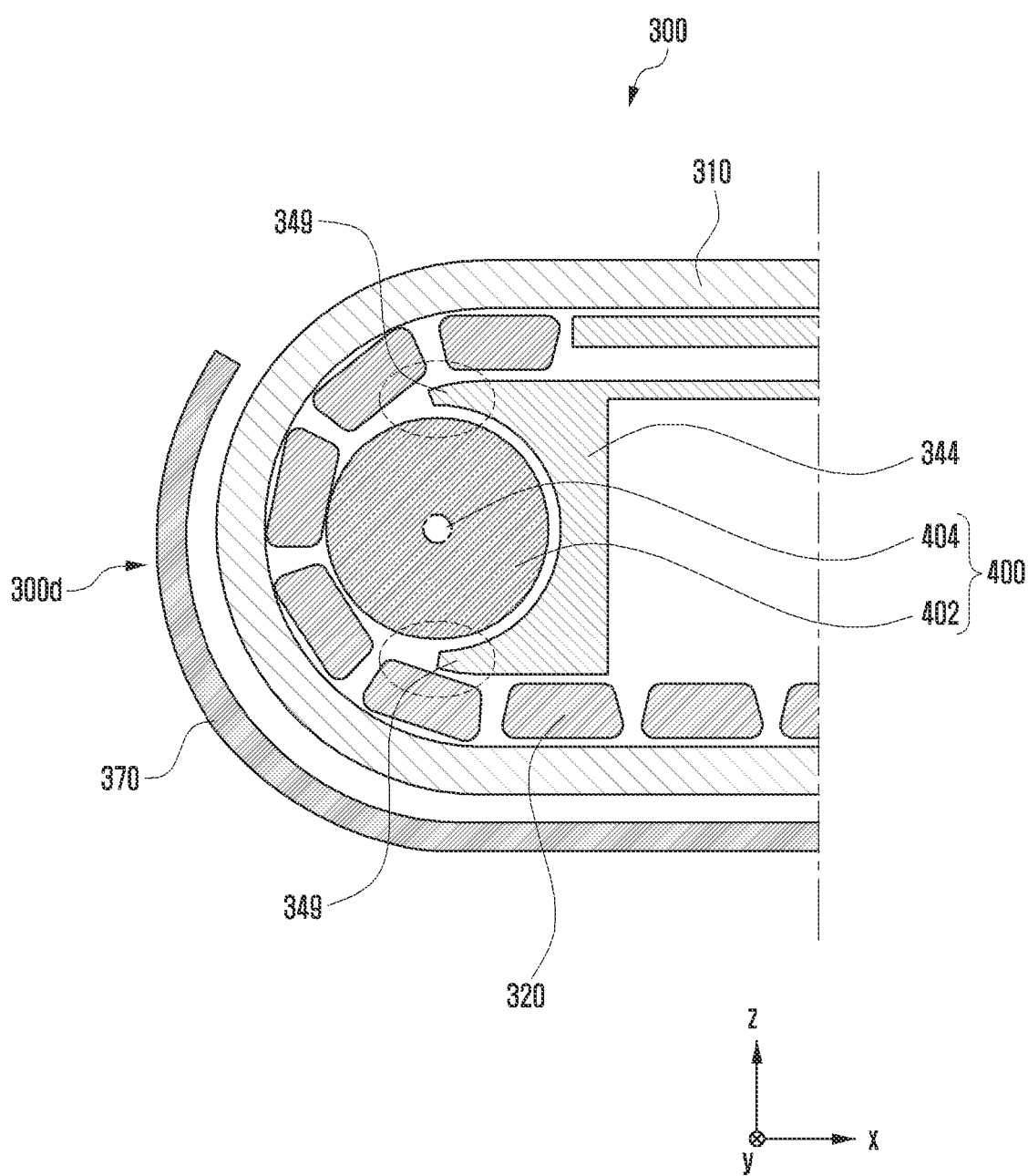
FIG. 20 is a view illustrating the shape of a sliding bar according to an embodiment of the disclosure.

FIG. 20 is a view illustrating the shape of a sliding bar according to an embodiment of the disclosure.

Referring to FIG. 20, the sliding bar 344 may include a protrusion 349 extending in length from the end of the sliding bar 344 so as to overlap at least a portion of the upper and lower portions of the roller 400. For example, the protrusion 349 may be applied as an extension portion supporting the flexible display 310 and/or the bendable member 320. In an embodiment, the protrusion 349 may be disposed to overlap at least a portion of the roller 400 when the sliding frame 340 is viewed from above. In an embodiment, the roller 400 may be formed to have a relatively small size (e.g., a diameter) through a protrusion 349 of a sliding bar 344 that extends near the roller 400 and is disposed to at least partially surround the roller 400, so the small size may enable other components of the electronic device 300 to be disposed in a provided space.

Figure 21:
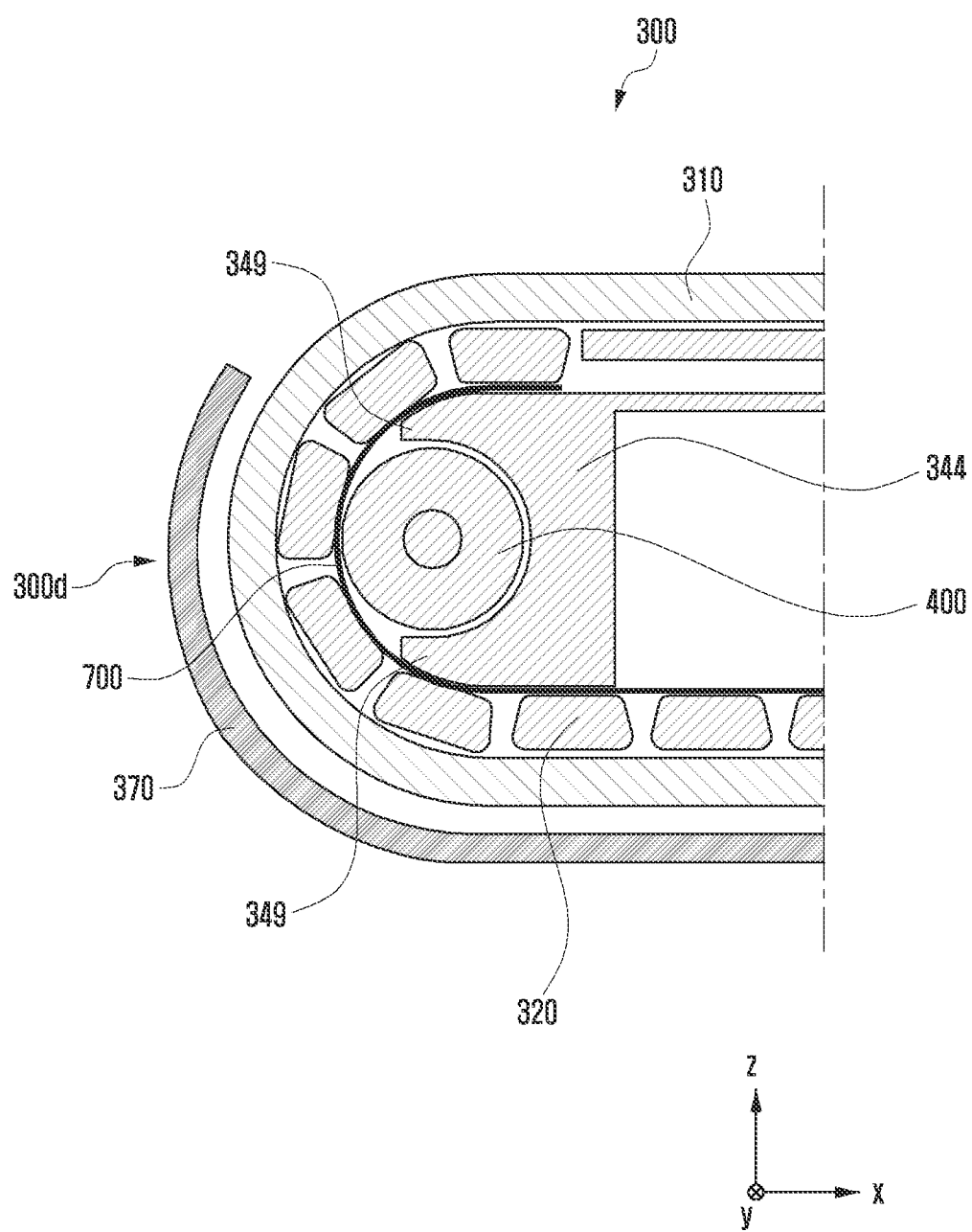
FIG. 21 is a view illustrating a buffer member disposed between a roller and a bendable member according to an embodiment of the disclosure.

FIG. 21 is a view illustrating a buffer member 700 disposed between a roller 400 and a bendable member 320 according to an embodiment of the disclosure.

Referring to FIG. 21, a buffer member 700 may be disposed between the roller 400 and the bendable member 320 to reduce friction between the roller 400 and the bendable member 320. The buffer member 700 may be in the form of a thin film capable of being inserted between the roller 400 and the bendable member 320, and may be formed of a rubber material or a Teflon tape. Since the roller 400 and the bendable member 320 do not come into direct contact with each other by the buffer member 700, frictional resistance may be reduced.

Figure 22:
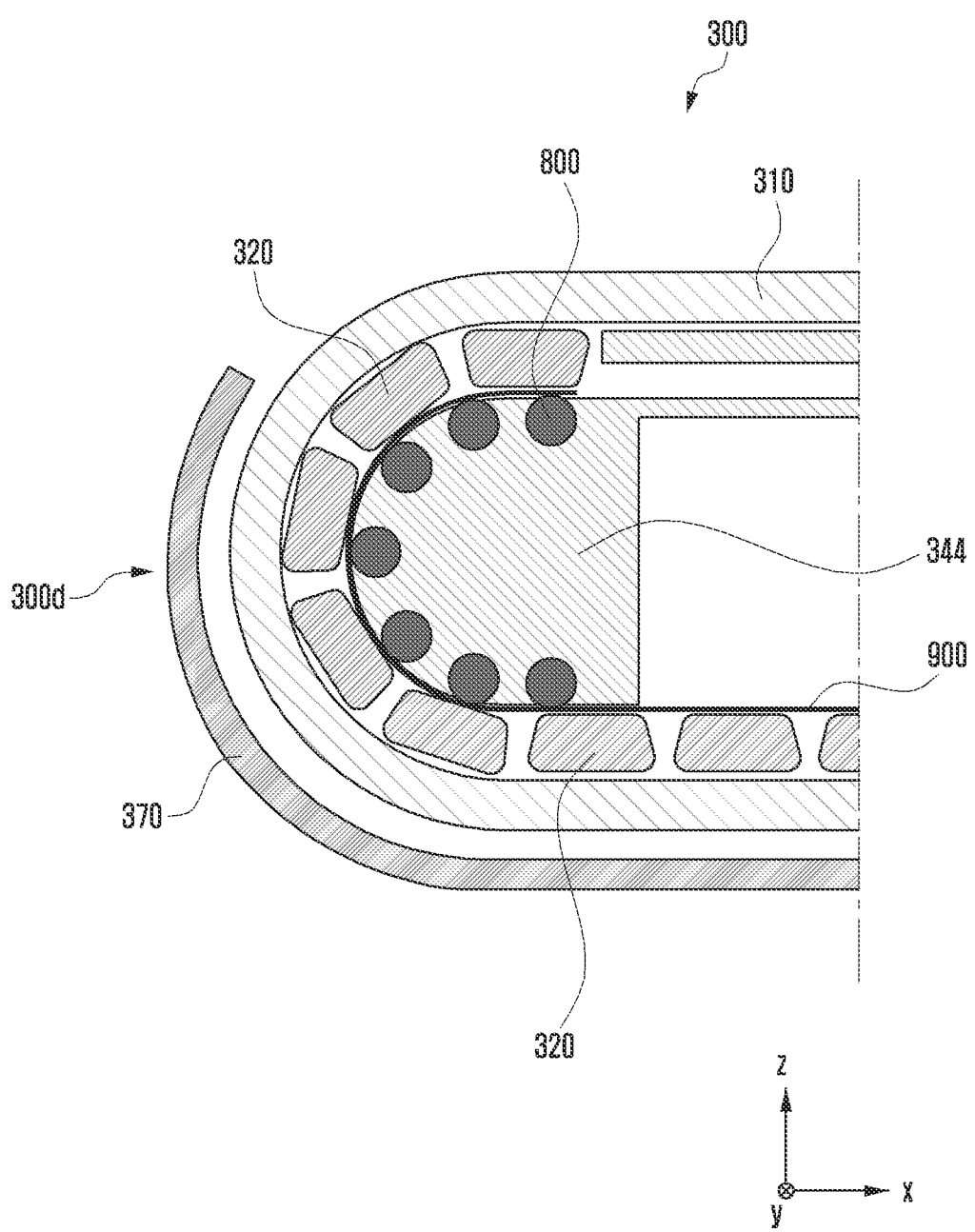
FIG. 22 is a view showing that a bearing is applied to a sliding bar according to an embodiment of the disclosure.

FIG. 22 is a view showing that a bearing 800 is applied to a sliding bar 344 according to an embodiment of the disclosure.

Referring to FIG. 22, a plurality of bearings 800 may be disposed on the outer side of the sliding bar 344 in order to reduce friction produced when the sliding bar 344 and the bendable member 320 come into contact with each other. The frictional force produced when the sliding bar 344 and the bendable member 320 come into contact with each other may be reduced by the plurality of bearings 800, and the plurality of bearings 800 may be separated from the sliding bar 344. In order to prevent the plurality of bearings 800 from being separated from the sliding bar 344, a buffer member 900 may be disposed to cover the plurality of bearings 800.

As an embodiment, in order to reduce friction produced when the sliding bar 344 and the bendable member 320 come into contact with each other in the curved portion 300d of the electronic device 300, a plurality of bearings 800 may be disposed on the sliding bar 344. The plurality of bearings 800 may be disposed at regular intervals from the lower portion to the upper portion of the sliding bar 344 to correspond to the entire area in which the sliding bar 344 and the bendable member 320 come into contact with each other. Accordingly, friction during the movement of the sliding frame 340 may be reduced by the plurality of bearings 800 disposed at regular intervals on the sliding bar 344. The buffer member 900 may be disposed between the sliding bar 344 and the bendable member 320. The buffer member 900 may be in the form of a thin film capable of being inserted between the sliding bar 344 and the bendable member 320, and may be formed of a rubber material or a Teflon tape. The sliding bar 344 and the bendable member 320 do not come into direct contact with each other by the buffer member 900, thereby reducing friction. In addition, friction produced when the sliding bar 344 and the bendable member 320 come into contact with each other may be reduced by the buffer member 900.

Figure 23:
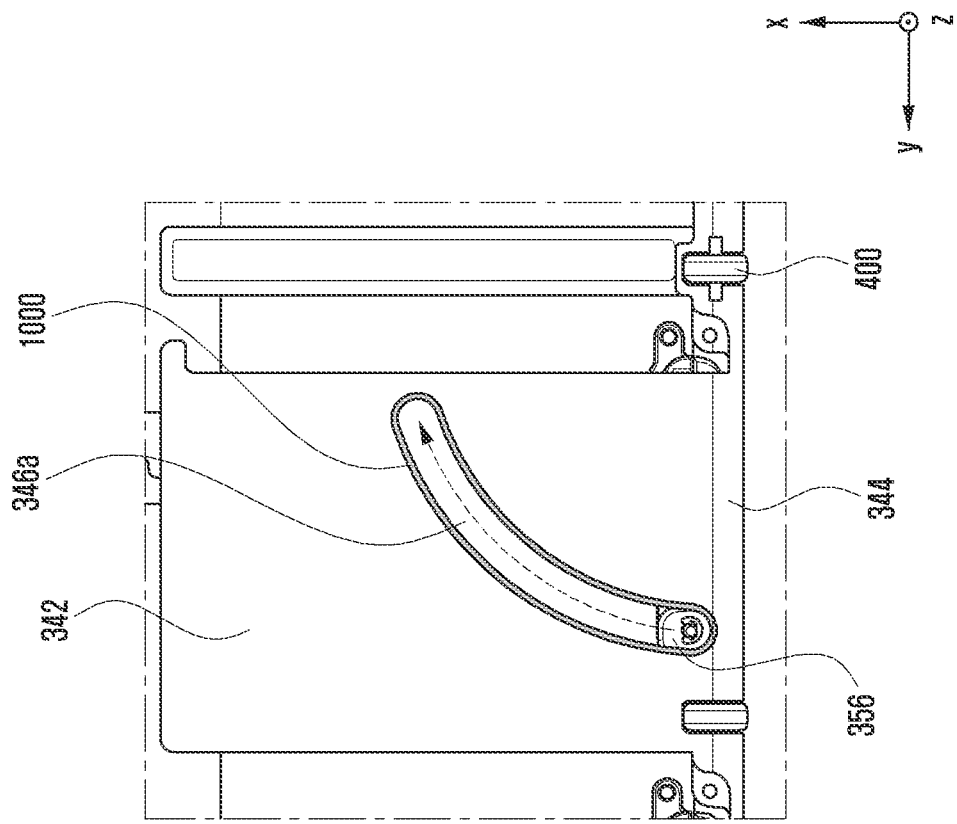
FIG. 23 is a view showing that a friction reducing member is applied to reduce friction between a driving shaft and a sliding frame according to an embodiment of the disclosure.
Figure 23:
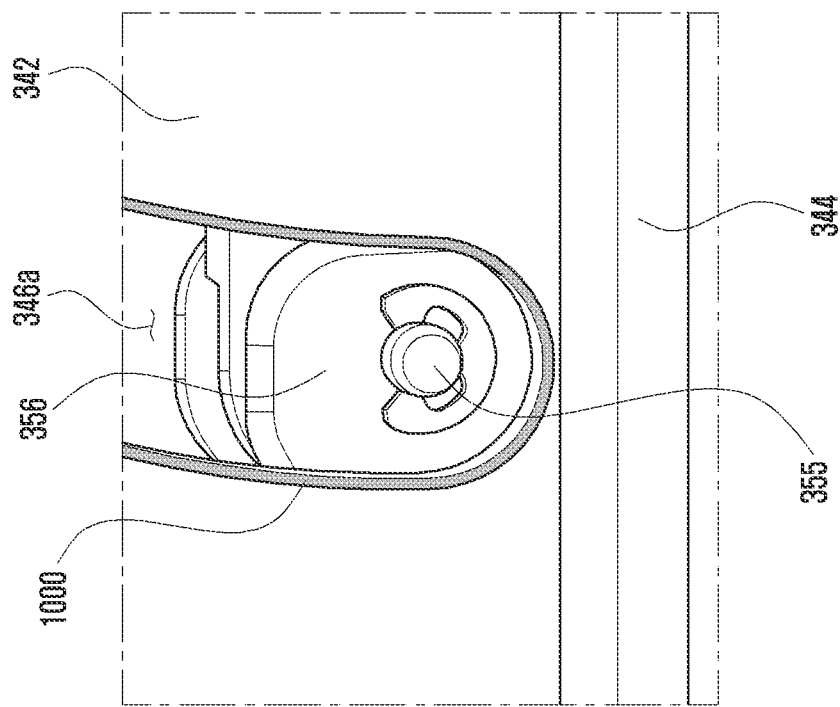

FIG. 23 is a view showing that a friction reducing member 1000 is applied to reduce friction between a driving shaft 356 and a sliding frame 340 according to an embodiment of the disclosure.

Referring to FIG. 23, the driving shaft 356 of the driving body 350 may be inserted into the first guide slit 346a of the sliding frame 340 to move, and friction may occur in the portion where the sliding frame 340 and the driving shaft 356 come into contact with each other.

In order to reduce friction in the portion where the sliding frame 340 and the driving shaft 356 come into contact with each other when the screen (e.g., the screen 2301 in FIGS. 2A and 2B) of the flexible display (e.g., the flexible display 310 in FIG. 3) is expanded or when the screen is contracted, a friction reducing member 1000 may be disposed between the first guide slit 346a and the driving shaft 356. The friction reducing member 1000 may be formed of a rubber material or a Teflon tape to reduce friction. Alternatively, a friction reducing layer may be formed on the first guide slit 356a.

However, the disclosure is not limited thereto, and a plurality of bearings may be disposed in the first guide slit 346a of the sliding frame 340, thereby reducing friction in the portion where the guide slit 346 and the driving shaft 356 come into contact with each other.

Although not shown, a friction reducing member may be disposed or a friction reducing layer may be included in the second guide slit (e.g., the second guide slit 346b in FIG. 7).

The electronic device according to various embodiments of the disclosure may reduce friction between a sliding bar and a bendable member during expansion and contraction of a screen of a display, thereby reducing power required for expansion and contraction of a screen of a flexible display.

According to various embodiments, an electronic device (e.g., the electronic device 300 in FIG. 3) may include a flexible display (e.g., the flexible display 310 in FIG. 3) including a first area (e.g., the first section ① in FIG. 2B) disposed to be visible to the outside and a second area (e.g., the second section ② in FIG. 2B) extending from the first area and disposed to be accommodated inside the electronic device in a first state and to be at least partially visible to the outside in a second state, a bendable member (e.g., the bendable member 320 in FIG. 3) disposed on the rear surface of the flexible display and configured to support the flexible display in the first state and the second state, a case (e.g., the front case 330 in FIG. 3) configured to support at least a portion of the flexible display, a sliding frame (e.g., the sliding frame 340 in FIG. 3) slidably coupled to the case and including a slide plate (e.g., the slide plate 342 in FIG. 3) having a plurality of first guide slits (e.g., a plurality of first guide slits 346 in FIG. 3) formed therein and a sliding bar (e.g., the sliding bar 344 in FIG. 3) extending from the slide plate and coming into contact with the bendable member in the second state, and a plurality of driving bodies (e.g., a plurality of driving bodies 350 in FIG. 3) configured to enable sliding movement of the flexible display while switching from the first state to the second state.

According to various embodiments, a plurality of rollers rotatably disposed at a predetermined interval on the sliding bar and configured to reduce friction when the flexible display slides may be included.

According to various embodiments, the plurality of rollers may be disposed between portions in which the plurality of driving bodies is coupled to the sliding bar.

According to various embodiments, the plurality of rollers may be disposed at a gap of 0.05 to 0.1 mm from the bendable member.

According to various embodiments, the sliding frame may include a protrusion extending in length from an end of the sliding bar, and the protrusion may be disposed to overlap at least a portion of the plurality of rollers when the sliding frame is viewed from above.

According to various embodiments, a buffer member disposed between the plurality of rollers and the bendable member may be included.

According to various embodiments, the buffer member may be formed of a rubber material, a urethane material, or a Teflon material.

According to various embodiments, the plurality of rollers may be formed of a rubber material, a urethane material, or a Teflon material.

According to various embodiments, a first housing configured to accommodate the case and including a locking device and a second housing configured to accommodate the sliding frame and including a locking jaw disposed at a position corresponding to the locking device in the first state may be included, and the locking device may be caught on the locking jaw, thereby maintaining the electronic device in the first state.

According to various embodiments, the plurality of driving bodies may include a first driving bar rotatably coupled to the sliding bar, a second driving bar rotatably coupled to the case, a driving shaft configured to couple the first drive bar and the second drive bar to be movable, and an elastic member configured to press the first driving bar and the second driving bar to be unfolded at a predetermined angle with respect to each other.

According to various embodiments, the plurality of driving bodies may include a first link portion formed at an end of the first driving bar for a connection with the sliding bar and a second link portion formed at an end of the second driving bar for a connection with the case.

According to various embodiments, the guide slits on a first side of the center of the sliding frame, among the plurality of first guide slits, may be formed to have a predetermined curvature in a first direction, and the guide slits on a second side thereof may be formed to have a predetermined curvature in a second direction opposite the first direction.

According to various embodiments, the driving shafts of the plurality of driving bodies may be at least partially inserted into the plurality of first guide slits and may move along curves of the plurality of first guide slits.

According to various embodiments, the driving bodies on a first side of the center of the sliding frame and the driving bodies on a second side thereof, among the plurality of driving bodies, may be disposed to be folded or unfolded in a symmetrical form with respect to each other.

According to various embodiments, friction reducing members disposed between the plurality of first guide slits and the driving shafts of the plurality of driving bodies may be included.

According to various embodiments, the friction reducing member may be formed of a rubber material, a urethane material, or a Teflon material.

According to various embodiments, the slide plate may include a plurality of second guide slits disposed between the plurality of first guide slits, and the plurality of second guide slits may be formed in a straight line.

According to various embodiments, the first link portion and the second link portion may be at least partially inserted into the plurality of second guide slits and may move along straight lines of the plurality of second guide slits.

According to various embodiments, a plurality of bearings disposed on the outer side of the sliding bar in order to reduce friction when the sliding bar and the bendable member come into contact with each other and a buffer member disposed to cover the plurality of bearings may be included.

According to various embodiments, a plurality of bearings disposed in the plurality of first guide slits in order to reduce friction against the driving shafts of the plurality of driving bodies may be included.

While the disclosure has been shown and described with reference to various embodiments thereof, it will be understood by those skilled in the art that various changes in form and details may be made therein without departing from the spirit and scope of the disclosure as defined by the appended claims and their equivalents.

The invention claimed is:

1. An electronic device comprising:
   a flexible display comprising a first area disposed to be visible from outside of the electronic device and a second area extending from the first area and disposed to be accommodated inside the electronic device in a first state and to be at least partially visible from outside of the electronic device in a second state;
   a bendable member disposed on a rear surface of the flexible display and configured to support the flexible display in the first state and the second state;
   a case configured to support at least a portion of the flexible display;
   a sliding frame comprising a slide plate slidably coupled to the case and a sliding bar, wherein the sliding bar is integrally formed with the slide plate;
   a plurality of driving bodies configured to enable sliding movement of the flexible display while switching from the first state to the second state; and
   a plurality of rollers rotatably disposed at the sliding bar and in contact with the bendable member.

2. The electronic device of claim 1, wherein the sliding frame is configured to be pressing the bendable member while switching from the first state to the second state through the slide bar.

3. The electronic device of claim 1, wherein each of the plurality of rollers is disposed between portions of the sliding bar to which the plurality of driving bodies are coupled.

4. The electronic device of claim 1, wherein the plurality of rollers is disposed at a gap of 0.05 to 0.1 mm from the bendable member.

5. The electronic device of claim 1,
   wherein the sliding frame comprises a protrusion extending in length from an end of the sliding bar, and wherein the protrusion is disposed to overlap at least a portion of the plurality of rollers when the sliding frame is viewed from above.

6. The electronic device of claim 1, comprising a buffer member disposed between the plurality of rollers and the bendable member.

7. The electronic device of claim 6, wherein the buffer member is formed of a rubber material, a urethane material, or a Teflon material.

8. The electronic device of claim 1, wherein the plurality of rollers is formed of at least one of a rubber material, a urethane material, or a Teflon material.

9. The electronic device of claim 1, comprising:
a first housing configured to accommodate the case and comprising a locking device; and
a second housing configured to accommodate the sliding frame and comprising a locking jaw disposed at a position corresponding to the locking device in the first state,
wherein in a case that the locking device is caught on the locking jaw the electronic device is maintained in the first state.

10. The electronic device of claim 1, wherein each of the plurality of driving bodies comprises:
a first driving bar rotatably coupled to the sliding bar,
a second driving bar rotatably coupled to the case,
a driving shaft configured to couple the first drive bar and the second drive bar to be movable, and
an elastic member configured to press the first driving bar and the second driving bar to be unfolded at a predetermined angle with respect to each other.

11. The electronic device of claim 10, wherein each of the plurality of driving bodies comprises
a first link portion formed at an end of the first driving bar for a connection with the sliding bar, and
a second link portion formed at an end of the second driving bar for a connection with the case.

12. The electronic device of claim 11,
wherein the sliding frame further comprises a plurality of first guide slits formed on a slide plate, and
wherein the guide slits on a first side of the center of the sliding frame, among the plurality of first guide slits, are formed to have a predetermined curvature in a first direction, and the guide slits on a second side thereof are formed to have a predetermined curvature in a second direction opposite the first direction.

13. The electronic device of claim 12, wherein the driving shafts of the plurality of driving bodies are at least partially inserted into the plurality of first guide slits and move along curves of the plurality of first guide slits.

14. The electronic device of claim 12, wherein the driving bodies on a first side of the center of the sliding frame and the driving bodies on a second side thereof, among the plurality of driving bodies, are disposed to be folded or unfolded in a symmetrical form with respect to each other.

15. The electronic device of claim 12, comprising friction reducing members disposed between the plurality of first guide slits and the driving shafts of the plurality of driving bodies.

16. The electronic device of claim 15, wherein the friction reducing members are formed of a rubber material, a urethane material, or a Teflon material.

17. The electronic device of claim 12,
wherein the slide plate comprises a plurality of second guide slits disposed between the plurality of first guide slits, and
wherein the plurality of second guide slits is formed in a straight line.

18. The electronic device of claim 17, wherein the first link portion and the second link portion are at least partially inserted into the plurality of second guide slits and move along straight lines of the plurality of second guide slits.

19. The electronic device of claim 12, comprising a plurality of bearings disposed on an outer side of the sliding bar in order to reduce friction when the sliding bar and the bendable member come into contact with each other, and a buffer member disposed to cover the plurality of bearings.

20. The electronic device of claim 12, comprising a plurality of bearings disposed in the plurality of first guide slits in order to reduce friction against the driving shafts of the plurality of driving bodies.

* * * * *